(12) United States Patent
Shue et al.

(10) Patent No.: US 7,888,719 B2
(45) Date of Patent: Feb. 15, 2011

(54) SEMICONDUCTOR MEMORY STRUCTURES

(75) Inventors: Shau-Lin Shue, Hsinchu (TW); Chao-An Jong, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 186 days.

(21) Appl. No.: 11/752,736

(22) Filed: May 23, 2007

(65) Prior Publication Data
US 2008/0290467 A1 Nov. 27, 2008

(51) Int. Cl.
*H01L 29/94* (2006.01)
*H01L 29/00* (2006.01)

(52) U.S. Cl. .................. 257/296; 257/1; 257/E27.006; 257/E27.084

(58) Field of Classification Search ...... 257/2, 257/246, 248, 295, 303, 642, 646, 296, 300, 257/E27.075, E27.084, E27.098, E21.661, 257/390, E27.081, E21.613, 1, 360, E27.006; 365/163, 49.1, 189.2, 149; 438/148, 652
See application file for complete search history.

(56) References Cited

U.S. PATENT DOCUMENTS

| | | | |
|---|---|---|---|
| 6,566,700 B2 | 5/2003 | Xu | |
| 6,586,761 B2 | 7/2003 | Lowrey | |
| 6,605,821 B1 | 8/2003 | Lee et al. | |
| 6,867,425 B2 | 3/2005 | Wicker | |
| 6,894,305 B2 | 5/2005 | Yi et al. | |
| 2002/0187633 A1* | 12/2002 | Akram | 438/652 |
| 2003/0001242 A1* | 1/2003 | Lowrey et al. | 257/646 |
| 2003/0209746 A1* | 11/2003 | Horii | 257/295 |
| 2003/0219924 A1 | 11/2003 | Bez et al. | |
| 2005/0002227 A1* | 1/2005 | Hideki et al. | 365/163 |
| 2005/0035342 A1 | 2/2005 | Chen | |
| 2005/0184282 A1 | 8/2005 | Lai et al. | |
| 2005/0191804 A1 | 9/2005 | Lai et al. | |
| 2006/0148229 A1 | 7/2006 | Wang et al. | |
| 2006/0189045 A1* | 8/2006 | Shum et al. | 438/148 |
| 2006/0266992 A1 | 11/2006 | Matsui et al. | |
| 2007/0012905 A1* | 1/2007 | Huang | 257/2 |

(Continued)

OTHER PUBLICATIONS

Y. N. Hwang et al., "Writing Current Reduction for High-density Phase-change RAM", 2003 IEEE, four pages.

(Continued)

*Primary Examiner*—Lynne A Gurley
*Assistant Examiner*—Galina Yushina
(74) *Attorney, Agent, or Firm*—Duane Morris LLP

(57) ABSTRACT

A semiconductor structure includes a first conductive layer coupled to a transistor. A first dielectric layer is over the first conductive layer. A second conductive layer is within the first dielectric layer, contacting a portion of a top surface of the first conductive layer. The second conductive layer includes a cap portion extending above a top surface of the first dielectric layer. A first dielectric spacer is between the first dielectric layer and the second conductive layer. A phase change material layer is above a top surface of the second conductive layer. A third conductive layer is over the phase change material layer. A second dielectric layer is over the first dielectric layer. A second dielectric spacer is on a sidewall of the cap portion, wherein a thermal conductivity of the second dielectric spacer is less than that of the first dielectric layer or that of the second dielectric layer.

20 Claims, 27 Drawing Sheets

U.S. PATENT DOCUMENTS

| | | | |
|---|---|---|---|
| 2007/0096162 A1* | 5/2007 | Happ et al. | 257/246 |
| 2007/0099377 A1* | 5/2007 | Happ et al. | 438/257 |
| 2007/0173010 A1 | 7/2007 | Lee et al. | |
| 2008/0044632 A1 | 2/2008 | Liu et al. | |
| 2008/0061341 A1* | 3/2008 | Lung | 257/303 |

OTHER PUBLICATIONS

R. Neale, "Amorphous non-volatile memory: the past and the future," Electronic Engineering, pp. 67-88, Apr. 2001.

Y. N. Hwang et al, "Full Integration and Reliability Evaluation of Phase-change RAM Based on 0.24 um-CMOS Technologies," 2003 Symposium on VLSI Technology Digest of Technical Papers.

* cited by examiner

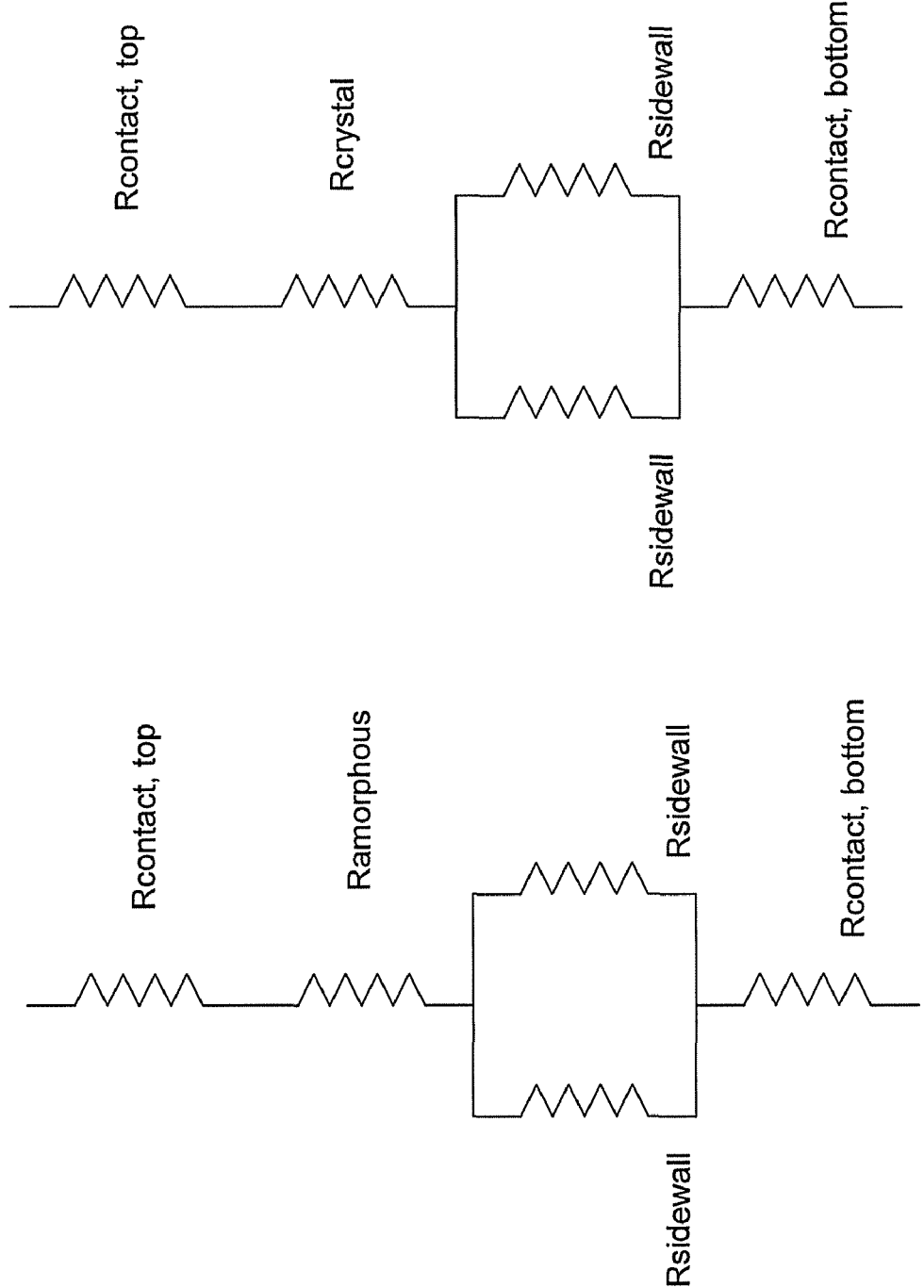

SEMICONDUCTOR MEMORY STRUCTURES

BACKGROUND OF THE INVENTION

1. Field of the Invention

The present invention relates, most generally, to semiconductor structures, and more particularly to phase change memory cells.

2. Description of the Related Art

With advances in electronic products, semiconductor technology has been applied widely in manufacturing memories, central processing units (CPUs), liquid crystal displays (LCDs), light emitting diodes (LEDs), laser diodes and other devices or chip sets. In order to achieve high-integration and high-speed requirements, dimensions of semiconductor integrated circuits have been reduced and various materials, such as copper and ultra low-k dielectrics, have been proposed and are being used along with techniques for overcoming manufacturing obstacles associated with these materials and requirements.

Generally, memory includes volatile memory and nonvolatile memory. Volatile memory such as dynamic random access memory (DRAM) is provided to store data or information of a system. A DRAM cell may include a transistor and a capacitor. Due to its simple structure, costs for manufacturing DRAM are low and the process for manufacturing DRAM is easier than for non-volatile memories. However, when voltages applied to DRAM are turned off, data stored in DRAM will disappear. Also, DRAM cells must be periodically refreshed to maintain the data stored therein, because of current leakages from DRAM capacitors.

Nonvolatile memory such as Flash memory has been widely used to maintain data even if input voltages applied to the Flash memory are removed. Data stored in Flash memory can be desirably removed by UV radiation or electrical erasing. However, a Flash memory cell usually includes multiple gate structures for storing data and is more complex than a DRAM cell. Further, the erase/re-write cycle of Flash memory is another issue due to leakage currents from floating gates of the Flash memory cell. Accordingly, processes for manufacturing Flash memory are more difficult than for DRAM, and costs for manufacturing high quality Flash memory with more erase/re-write cycles are comparatively high.

Recently, various nonvolatile memories such as phase-change memory (PCM), magnetic random access memory (MRAM) or ferroelectric random access memory (FRAM) having cell structures that are similar to those of DRAM have been proposed.

FIG. 1 is a schematic equivalent circuit of a PCM cell.

Referring to FIG. 1, a PCM cell 100 includes a transistor 110 and a PCM capacitor 120. A source/drain (S/D) of the transistor 110 is coupled to ground, and another S/D of the transistor 110 is coupled to one end of the PCM capacitor 120. The gate of the transistor 110 is coupled to a gate voltage $V_G$. Another end of the PCM capacitor 120 is coupled to a bit line voltage $V_{BL}$.

When the data stored within the PCM capacitor 120 is to be accessed, the voltage $V_G$ is applied to and turns on the transistor 110, and the bit line voltage $V_{BL}$ is applied to the PCM capacitor 120, such that a read current may flow through the PCM capacitor 120 and the transistor 110. Based on the level of the output current, the data stored within the PCM capacitor 120 is accessed.

By changing the phase of a phase change material (not shown) within the PCM capacitor 120, the impedance of the PCM capacitor 120 may dramatically change. For example, the PCM capacitor 120 may have a low impedance and a read current (not shown) flowing through the capacitor 120 and the transistor 110 may be high. The low-impedance PCM capacitor 120 may store a data value of "1." However, if the PCM capacitor 120 has a high impedance, a read current (not shown) flowing through the capacitor 120 and the transistor 110 is low, and the high-impedance PCM capacitor 120 may store a data value of "0."

Since the PCM cell 100 includes one transistor 110 and one PCM capacitor 120, the PCM cell 100 is simple and the process for manufacturing the PCM cell 100 may be easier than that of Flash memory. In addition, PCM transistor 100 uses phase changes of the phase change material (not shown) to define the stored data "0" and "1." The concern for current leakage of the PCM capacitor 120 may be substantially reduced.

Based on the foregoing, PCM structures are desired.

SUMMARY OF THE INVENTION

In accordance with some exemplary embodiments, a semiconductor structure includes a transistor over a substrate. The transistor includes a gate and a contact region adjacent to the gate and within the substrate. A first conductive layer is over the contact region. A first dielectric layer is over the first conductive layer. A second conductive layer is within the first dielectric layer, contacting at least a portion of a top surface of the first conductive layer. The second conductive layer includes a cap portion extending above a top surface of the first dielectric layer. At least one first dielectric spacer is between the first dielectric layer and the second conductive layer. A phase change material layer is above a top surface of the second conductive layer. A third conductive layer is over the phase change material layer. A second dielectric layer is over the first dielectric layer. At least one second dielectric spacer is on a sidewall of the cap portion, wherein a thermal conductivity of the second dielectric spacer is less than a thermal conductivity of the first dielectric layer or a thermal conductivity of the second dielectric layer.

The above and other features will be better understood from the following detailed description of the preferred embodiments of the invention that is provided in connection with the accompanying drawings.

BRIEF DESCRIPTION OF THE DRAWINGS

Following are brief descriptions of exemplary drawings. They are mere exemplary embodiments and the scope of the present invention should not be limited thereto.

FIGS. 2I-2O are schematic cross-sectional views showing exemplary PCM cells.

FIGS. 3B and 3C are schematic equivalent circuits of exemplary PCM capacitors.

DETAILED DESCRIPTION OF EXEMPLARY EMBODIMENTS

Figure 1:
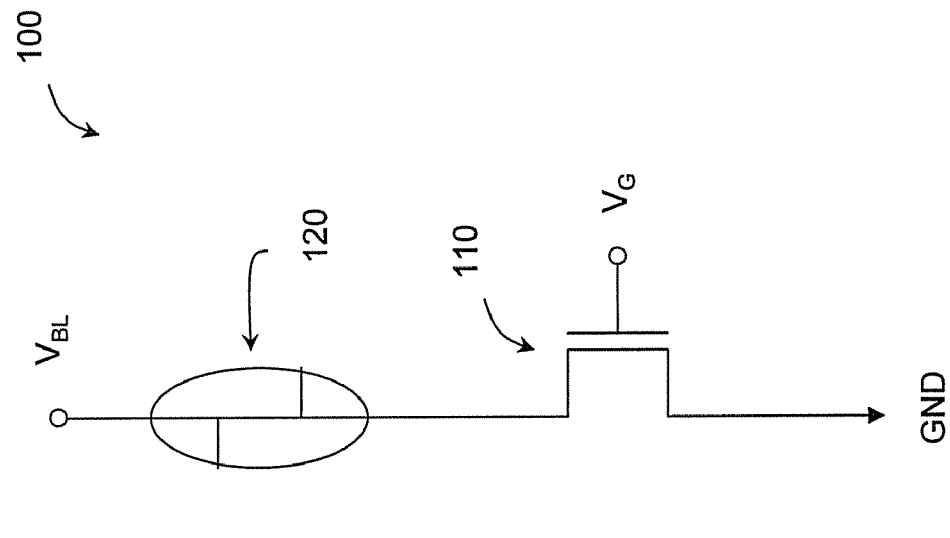
FIG. 1 is a schematic equivalent circuit of a phase-change memory (PCM) cell.

This description of the exemplary embodiments is intended to be read in connection with the accompanying drawings, which are to be considered part of the entire written description. In the description, relative terms such as "lower," "upper," "horizontal," "vertical," "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description and do not require that the apparatus/device be constructed or operated in a particular orientation.

FIGS. 2A-2H are schematic cross-sectional views showing an exemplary method for forming a phase-change memory (PCM) cell.

Figure 2A:
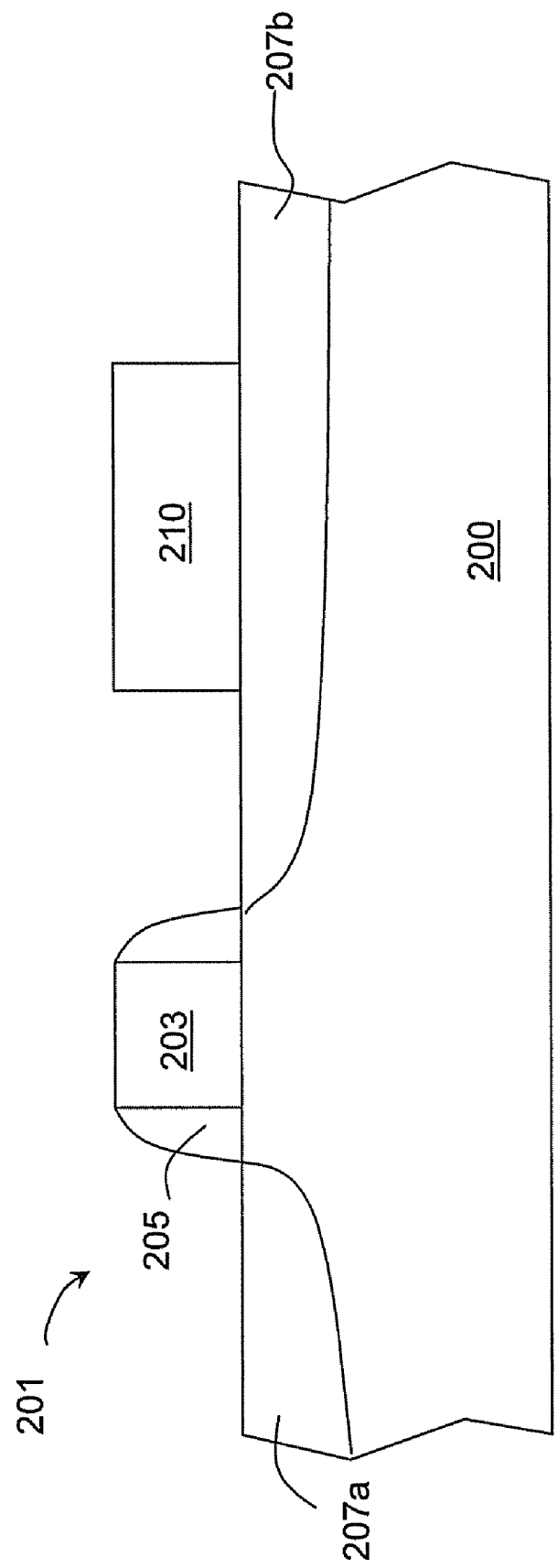
FIGS. 2A-2H are schematic cross-sectional views showing an exemplary method for forming a PCM cell.

Referring to FIG. 2A, a transistor 210 is formed over a substrate 200. The transistor 201 may comprise, for example, a gate 203 formed over the substrate 200. Spacers 205 are formed on the sidewalls of the gate 203. Contact regions 207a, 207b are formed adjacent to the gate 203 or spacers 205 and within the substrate 200. A conductive layer 210 is formed over the contact region 207b.

The substrate 200 can be a silicon substrate, a III-V compound substrate, a silicon/germanium (SiGe) substrate, a silicon-on-insulator (SOI) substrate, a display substrate such as a liquid crystal display (LCD), a plasma display, an electro luminescence (EL) lamp display, or a light emitting diode (LED) substrate, for example.

In some embodiments, the gate 203 may comprise a dielectric layer (not shown) thereunder. The dielectric layer (not shown) may be generally referred to as a gate dielectric layer. The dielectric layer (not shown) may be, for example, a silicon oxide layer, a silicon nitride layer, a silicon oxynitride layer, a high-k dielectric layer containing a material such as $HfO_2$, $HfSiO_4$, $ZrO_2$, $ZrSiO_4$, $Ta_2O_5$, HfSiON or the like, a multiple-layer structure or various combinations thereof. In some embodiments, the dielectric layer (not shown) may be formed by, for example, a thermal oxidation process, a chemical vapor deposition (CVD) process, an epitaxy process, other suitable processes, or various combinations thereof.

The gate 203 is formed over the substrate 200. The gate 203 may comprise, for example, a silicon layer, a polysilicon layer, an amorphous silicon layer, a SiGe layer, a conductive material layer, a metallic layer, other suitable layers, or various combinations thereof. In some embodiments, the gate 203 may be formed by, for example, a CVD process but other suitable formation processes may alternatively be used.

The spacers 205 may comprise, for example, at least one dielectric material such as oxide, nitride, oxynitride, or other dielectric material or various combinations thereof. The process for forming the spacers 205 may comprise, for example, forming a substantially conformal dielectric layer (provided for forming the spacers 205) over the gate 203 and the substrate 200 by a chemical vapor deposition (CVD) process. An etch process such as an etch-back process is applied to remove a portion of the dielectric layer (not shown) so as to form the spacers 205.

In some embodiments, the contact regions 207a, 207b are generally referred to as source/drain (S/D) regions. The contact regions 207a, 207b may be formed by, for example, an ion implantation process with dopants at least one of boron, phosphorus, arsenic, or the like or combinations thereof. In some embodiments, the contact regions 207a, 207b may comprise at least one lightly-doped drain (LDD) region (not shown) under the spacer 205 and adjacent to the gate 203.

The conductive layer 210 may comprise a material comprising at least one of metallic material (e.g., titanium tungsten (TiW), W, platinum (Pt), platinum iridium (PtIr), copper (Cu), aluminum (Al), AlCu, aluminum silicon copper (AlSiCu) or other metallic material); metallic nitride (e.g., titanium nitride (TiN), tantalum nitride (TaN), titanium silicon nitride (TiSiN), titanium aluminum nitride (TiAlN), titanium carbon nitride (TiCN), tantalum silicon nitride (TaSiN), tantalum aluminum nitride (TaAlN), tungsten nitride (WN) or other metallic nitride); metallic silicide (e.g., titanium silicide ($TiSi_x$), nickel silicide ($NSi_x$), cobalt silicide ($CoSi_x$) or other metallic silicide); conductive oxide (e.g., iridium oxide ($IrO_2$), ruthenium oxide ($RuO_2$), iridium ruthenium oxide ($IrRuO_3$), lithium niobate ($LiNbO_3$) or other conductive oxide) or composite material layers (e.g., Ti/TiN, Ta/TaN, TiN/W, TaN/Ta/Cu or other composite material layer). The conductive layer 210 may be formed, for example, a CVD process, a physical vapor deposition (PVD) process, an electroplating process, a electroless plating process or other process which is adequate to form a material layer or combinations thereof. In some embodiments using 0.13-µm technology, the conductive layer 210 may have a width, in cross-sectional view, of about 150 nanometers (nm) or less.

Figure 2B:
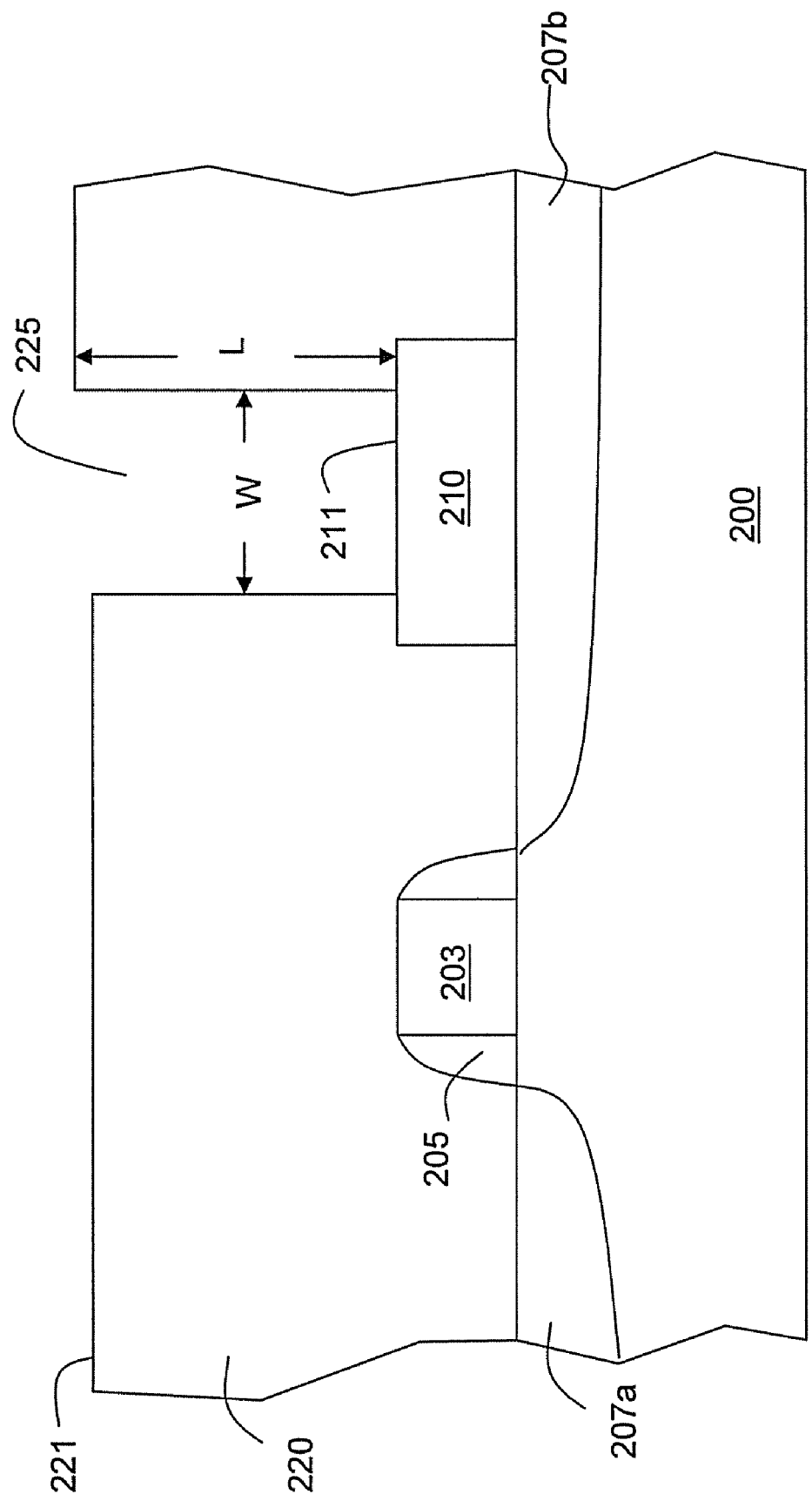

Referring to FIG. 2B, a dielectric layer 220 is formed over the transistor 201 (shown in FIG. 2A) and the conductive layer 210. The dielectric layer 220 may comprise at least one opening 225 at least partially exposing the top surface 211 of the conductive layer 210. In some embodiments, the opening 225 may be formed by, for example, a single damascene process.

The dielectric layer 220 may comprise a material such as oxide, nitride, oxynitride, low-k material, ultra-low-k dielectric or other dielectric material or combinations thereof. The dielectric layer 220 may be formed, for example, a plasma-enhanced CVD (PECVD) process, a spin-on-glass (SOG) process, an undoped silicate glass (USG) process or other process that is adequate to form a dielectric layer or combinations thereof.

In some embodiments, the process for forming the opening 225 may comprise, for example, forming a patterned photoresist layer (not shown) over an unpatterned dielectric layer 220. The patterned photoresist layer has an opening (not shown) corresponding to the opening 225. An etch process then partially removes the dielectric layer 220 so as to define the opening 225. After the etch process, the patterned photoresist layer may be removed by, for example, a photoresist removing process. In some embodiments using 0.13-µm technology, the opening 225 may have a depth "L" between about 50 nm and about 500 nm and a width "W" of about 200 nm or less. In some embodiments, the opening 225 may have an aspect ratio (L/W) between about 0.25 and about 5.

Figure 2C:
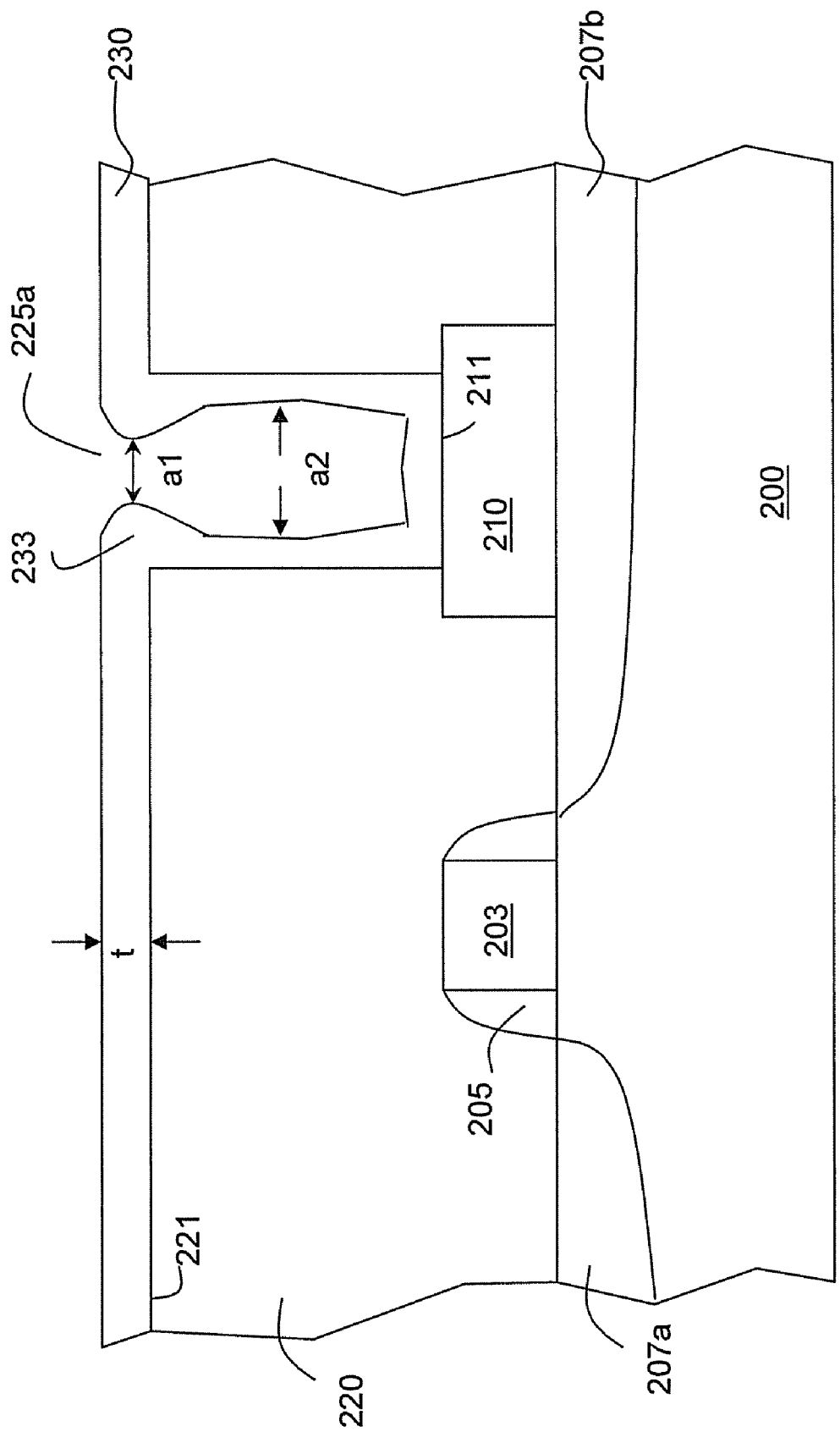

Referring to FIG. 2C, a dielectric layer 230 is formed, covering the dielectric layer 220 and the opening 225. In some embodiments, the dielectric layer 230 may have overhangs 233 adjacent to the top region (not labeled) of the opening 225 so as to reduce the width "W" of the opening 250 to the space "a1" of the opening 250a at the top region.

In some embodiments, the dielectric layer 230 may comprise a material comprising at least one of tantalum oxynitride (TaON), tantalum pentoxide ($Ta_2O_5$), aluminum oxide ($Al_2O_3$), or the like or various combinations thereof. The dielectric layer 230 having the overhangs 233 may be formed by, for example, a PVD process. By forming the overhangs 233, the dimension-reduced opening 225a may have a space "a1" at the top region of the opening 225a which may be smaller than a space "a2" at the middle region of the opening 225a.

In some embodiments using 0.13-µm technology, the dielectric layer 230 may have a thickness "t" of about 50 nm or less.

Figure 2D:
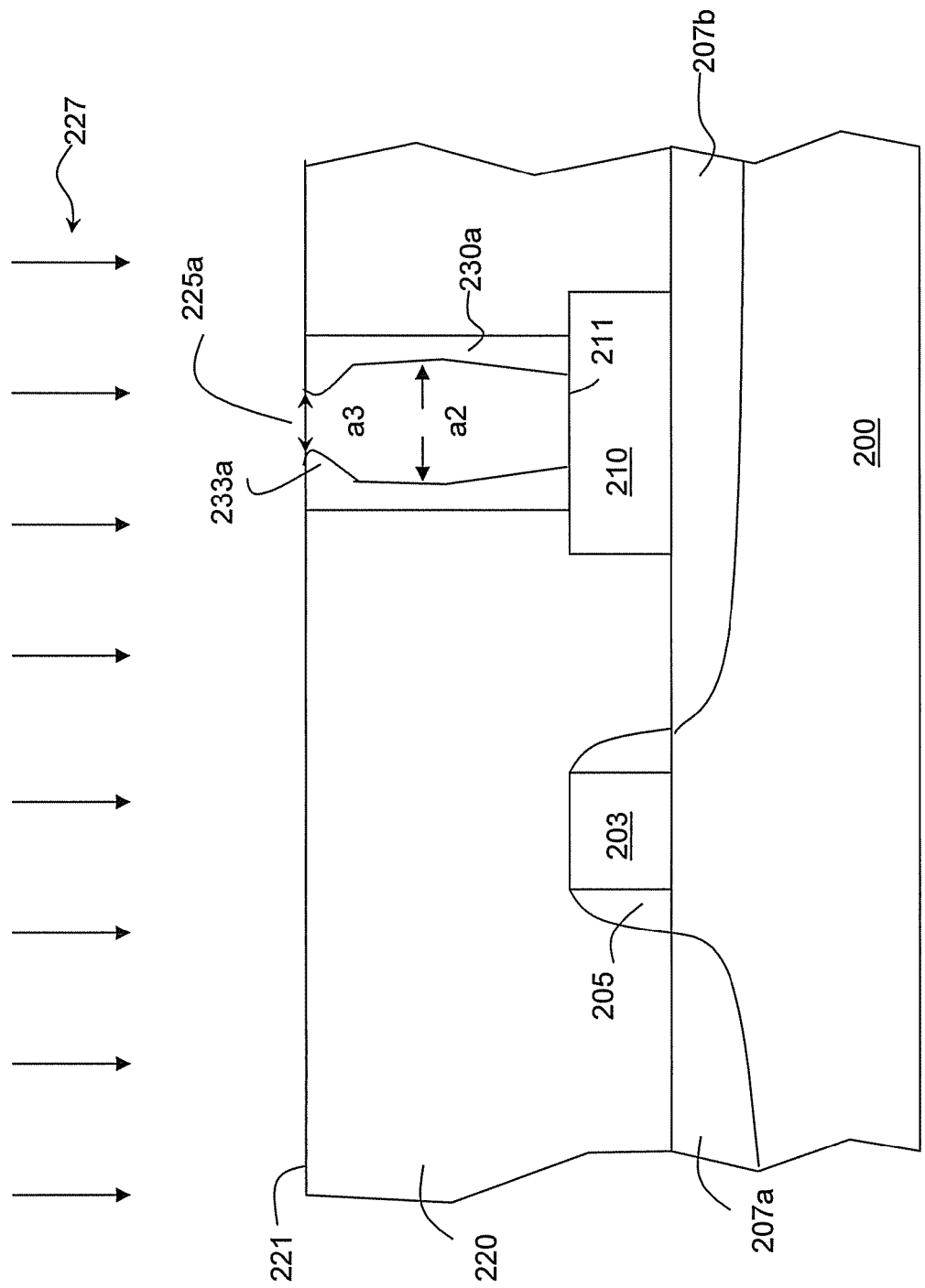

Referring to FIG. 2D, a removal process 227 is applied to partially remove the dielectric layer 230 (shown in FIG. 2C) as so to form spacers 230a on the sidewalls of the dielectric layer 220.

The removal process 227 may comprise, for example, an etch-back process removing a portion of the dielectric layer 230 (shown in FIG. 2C) over the surface 211 of the dielectric layer 220 and on the top surface 211 of the conductive layer 210. After the removal process 227, the surface 221 of the dielectric layer 220 and the top surface 211 of the conductive layer 210 are partially exposed. The remaining overhangs 233a are formed in the top region of the opening 225a such that the space "a3" in the top region of the opening 225a is smaller than the space "a2" in the medium region of the opening 225a. In some embodiments, the space "a3" may be smaller than the space "a1" (shown in FIG. 2C).

Figure 2E:
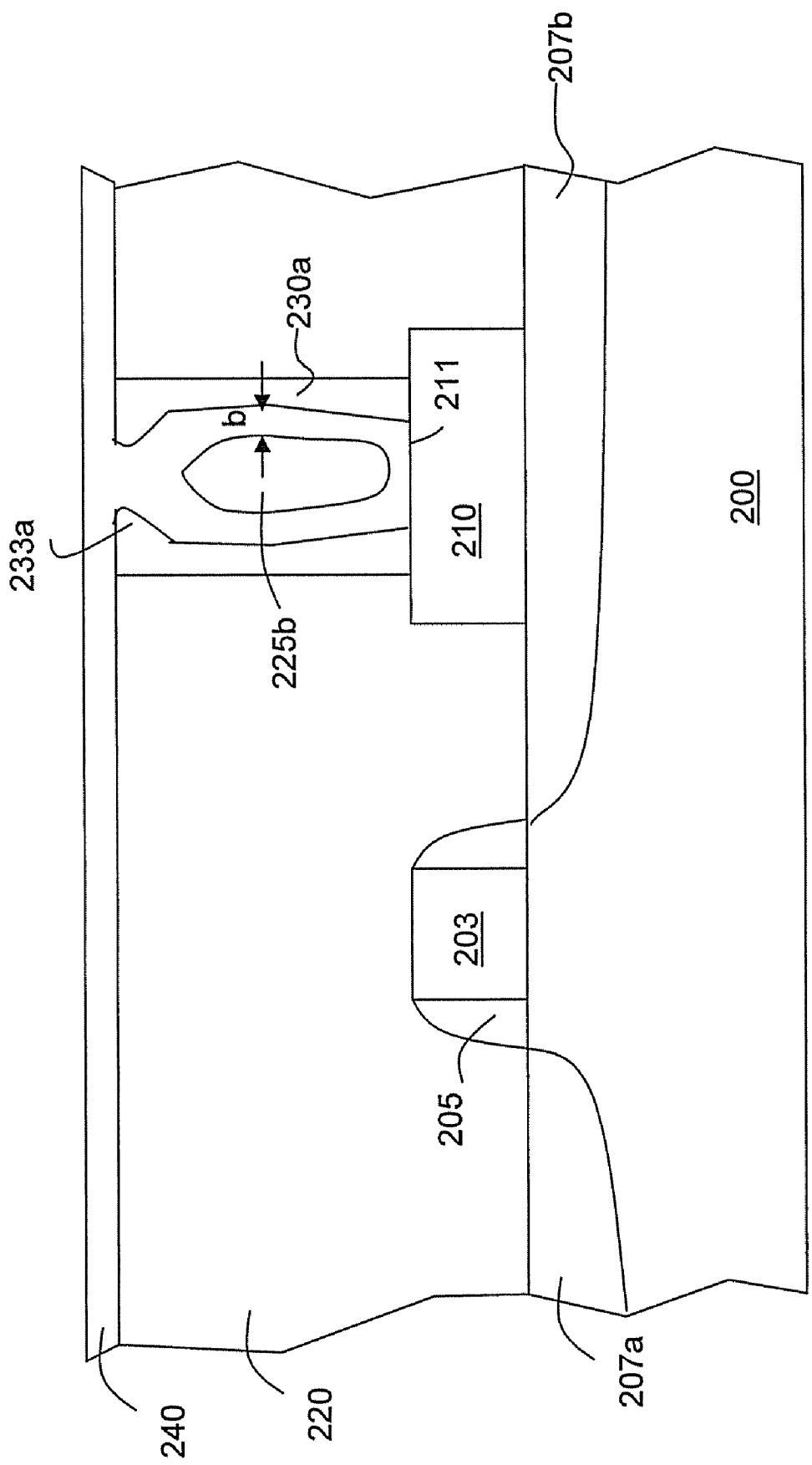

Referring to FIG. 2E, a conductive layer 240 is formed over the dielectric layer 220 and the spacers 230a. The conductive layer 240 contacts the exposed top surface 211 of the conductive layer 210 for electrical connection. In some embodiments, the conductive layer 240 may be substantially conformal over the structure shown in FIG. 2D so as to seal the gap 225b therein. Accordingly, the spacers 230a and the dielectric layer 220 are around the gap 225b. In some embodiments, the conductive layer 240 formed on the overhangs 233a are gradually extended toward the center of the opening 225a (shown in FIG. 2D) such that two portions of the conductive layer 240 formed on the overhangs 223a contact each other and seal the gap 225b as shown in FIG. 2E.

In some embodiments, the conductive layer 240 may comprise a material comprising at least one of polysilicon, titanium silicon carbide (TiSiC), carbon, TiW, silicon carbide (SiC), molybdenum nitride (MoN), Ti, vanadium (V), W, chromium (Cr), iron (Fe), Ni, niobium (Nb), palladium (Pd), Pt, zirconium (Zr), Mo, Cu, Al, silver (Ag), gold (Au), Hafnium (Hf), TiN, TaN, TiSiN, TiAlN, TiCN, TaSiN, TaAlN, WN, TiSi$_x$, NSi$_x$, CoSi$_x$, IrO$_2$, RuO$_2$, IrRuO$_3$, LiNbO$_3$ or other conductive material or various combinations thereof. In some embodiments, the conductive layer 240 may be formed by, for example, an atomic layer deposition (ALD) process, a CVD process, a PVD process, or the like or combination thereof.

In some embodiments using 0.13-µm technology, the conductive layer 240 at the medium region of the gap 225b may have a thickness "b" of about 25 nm or less.

Figure 2F:
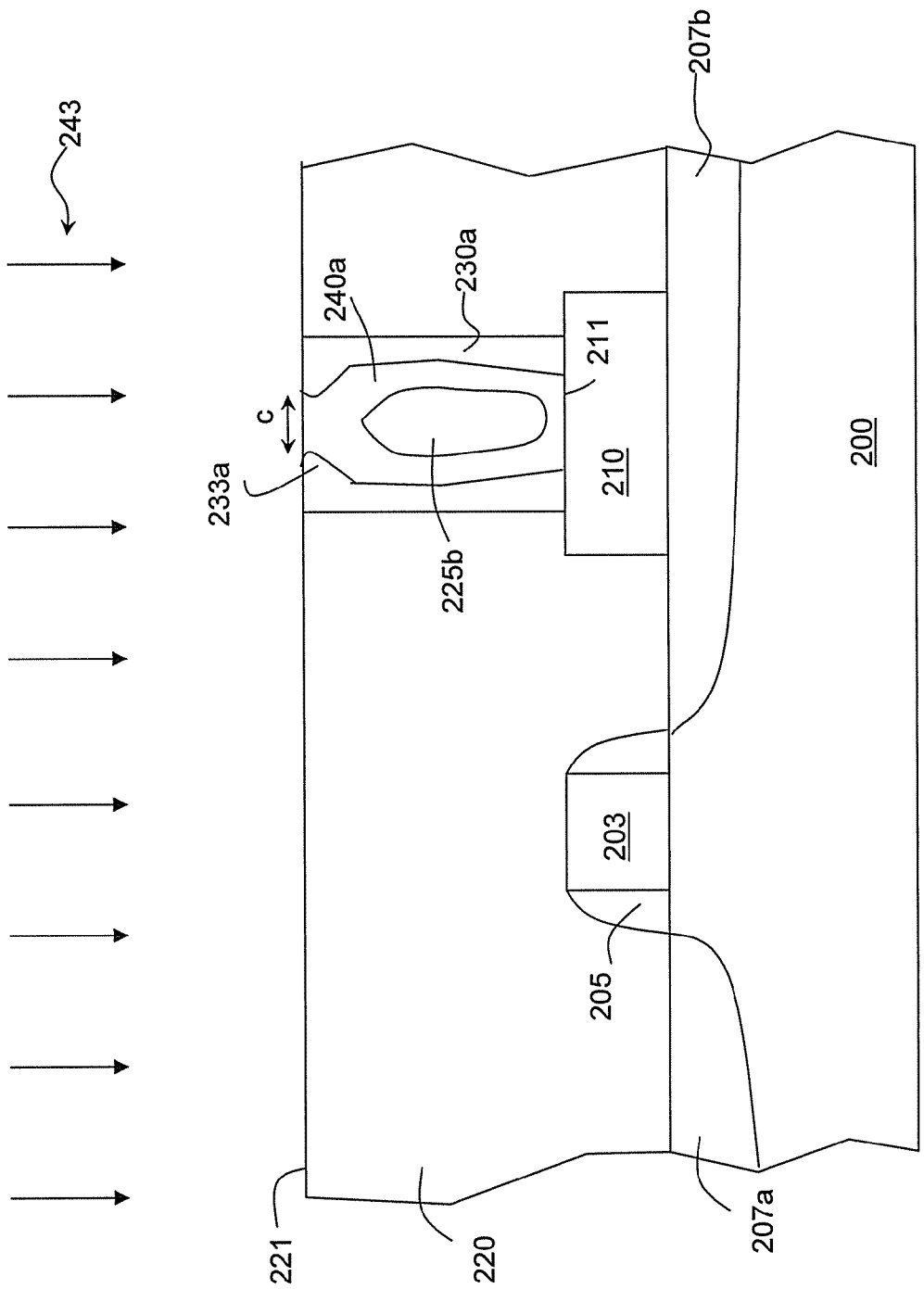

Referring to FIG. 2F, a removal process 243 is applied to remove a portion of the conductive layer 240 (shown in FIG. 2E) so as to form the conductive layer 240a sealing the gap 225b. In some embodiments, the conductive layer 240a may be referred to as a bottom electrode of a phase change memory (PCM) cell.

The removal process 243 may comprise, for example, a chemical-mechanical polishing (CMP) process, an etch-back process, or the like or combinations thereof. The removal process 243 removes a portion of the conductive layer 240 over the surface 221 of the dielectric layer 220 so as to form the conductive layer 240a. After the removal process 243, the top surface 221 of the dielectric layer 220 may be substantially exposed. The top surface (not labeled) of the conductive layer 240 and the top surface 221 of the dielectric layer 220 may have a substantially level surface. The distance "c" of the conductive layer 240 at the substantially level surface is less than the width "W" of the opening 225 (shown in FIG. 2B). In some embodiments using 0.13-µm technology, the distance "c" may be about 50 nm or less.

Figure 2G:
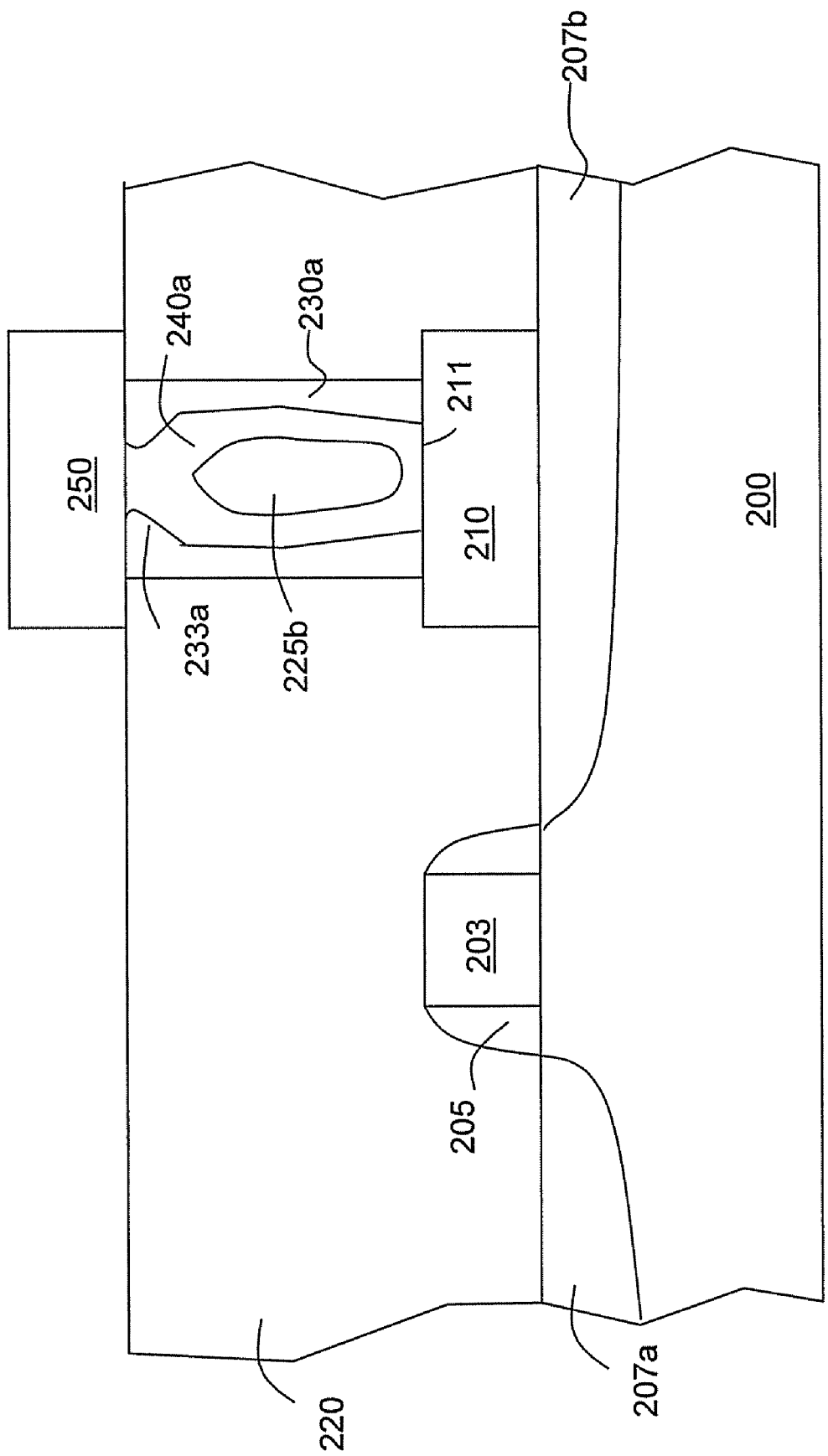

Referring to FIG. 2G, a phase change material (PCM) layer 250 is formed over the conductive layer 240a. In some embodiments, the PCM layer 250 may substantially completely cover the top surface of the conductive layer 240a.

The PCM layer 250 may comprise a material comprising at least one of germanium-antimony-tellurium (GST), GST:N, GST:O and indium-silver-antimony-tellurium (InAgSbTe). The PCM layer 250 may be formed by, for example, a CVD process, a PVD process, or other process that is adequate to form a PCM layer or combinations thereof. In some embodiments using 0.13-µm technology, the PCM layer 250 may have a thickness between about 100 nm and about 200 nm.

In some embodiments, the PCM layer 250 may have different resistances in an amorphous state and a crystalline state. For example, the resistance of an amorphous PCM layer may be a thousand time the resistance of a crystalline PCM layer.

Figure 2H:
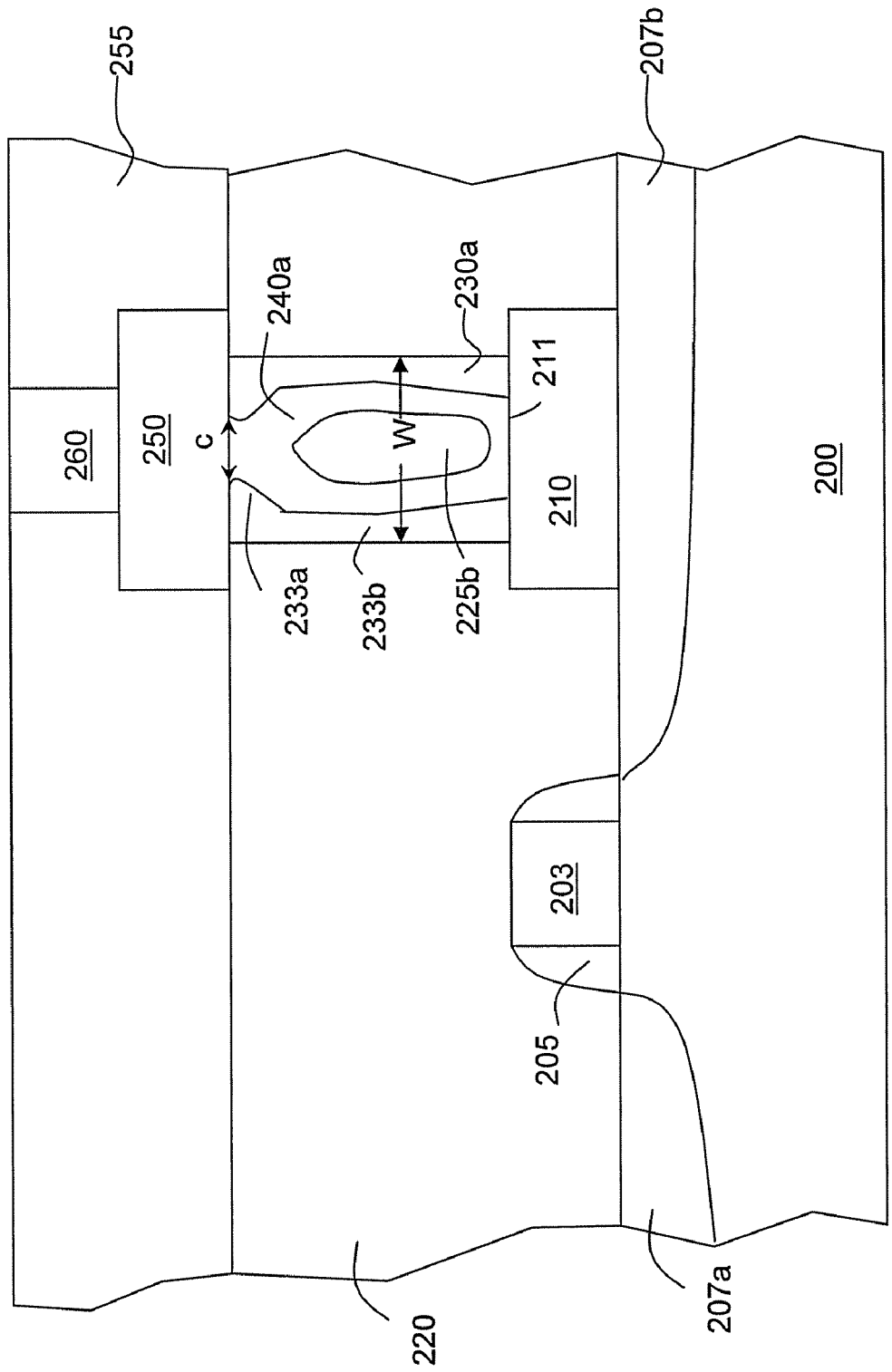
Figure 21:
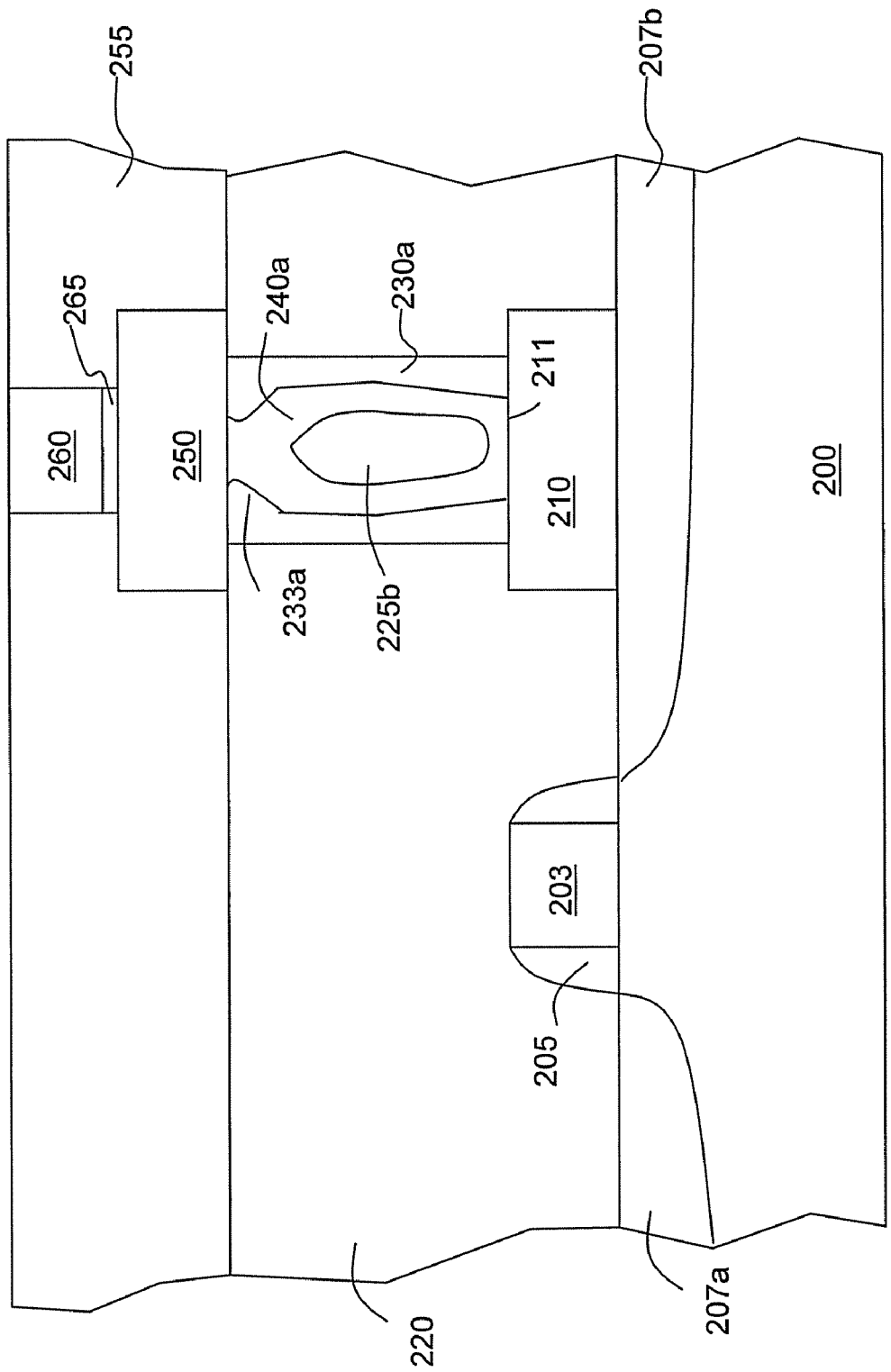

Referring to FIG. 2H, a dielectric layer 255 is formed over the PCM layer 250 and a conductive layer 260 is formed within the dielectric layer 255, contacting the PCM layer 250.

The dielectric layer 255 may comprise a material such as oxide, nitride, oxynitride, low-k material, ultra-low-k dielectric or other dielectric material or combinations thereof. The dielectric layer 255 may be formed by, for example, a CVD process, a spin-coating process or other process that is adequate to form a dielectric layer or combinations thereof.

The conductive layer 260 is formed over the PCM layer 250 for electrical connection. In some embodiments, the conductive layer 260 may be referred to as "a top electrode."

The conductive layer 260 may comprise a material comprising at least one of metallic material (e.g., titanium tungsten (TiW), W, platinum (Pt), platinum iridium (PtIr), copper (Cu), aluminum (Al), AlCu, aluminum silicon copper (AlSiCu) or other metallic material); metallic nitride (e.g., titanium nitride (TiN), tantalum nitride (TaN), titanium silicon nitride (TiSiN), titanium aluminum nitride (TiAlN), titanium carbon nitride (TiCN), tantalum silicon nitride (TaSiN), tantalum aluminum nitride (TaAlN), tungsten nitride (WN) or other metallic nitride); metallic silicide (e.g., titanium silicide (TiSi$_x$), nickel silicide (NSi$_x$), cobalt silicide (CoSi$_x$) or other metallic silicide); conductive oxide (e.g., iridium oxide (IrO$_2$), ruthenium oxide (RuO$_2$), iridium ruthenium oxide (IrRuO$_3$), lithium niobate (LiNbO$_3$) or other conductive oxide) or composite material layers (e.g., Ti/TiN, Ta/TaN, TiN/W, TaN/Ta/Cu or other composite material layer). The conductive layer 260 may be formed, for example, a CVD process, a physical vapor deposition (PVD) process, an electroplating process, a electroless plating process or other process which is adequate to form a material layer or combinations thereof.

Referring again to FIG. 2H, the spacer 230a has the top portion 233a and the middle portion 233b. The top portion 233a may have a thickness, at least in cross-sectional view, larger than that of the middle portion 233b. The interface distance "c" between the PCM layer 250 and the conductive layer 240a is less than the width "W."

FIGS. 2I-2O are schematic cross-sectional views showing exemplary PCM cells.

Referring to FIG. 2I, a glue layer 265 is formed between the conductive layer 260 and the PCM layer 250. The glue layer 265 is provided to enhance the adhesion between the conductive layer 260 and the PCM layer 250. The glue layer 265 may comprise, for example, Ti/TiN layers, Ta/TaN layers, or the like or combinations thereof. In some embodiments using 0.13-μm technology, the glue layer 265 may have a thickness between about 50 Å and about 100 Å. The glue layer 265 may be formed by, for example, a PVD process.

Figure 2J:
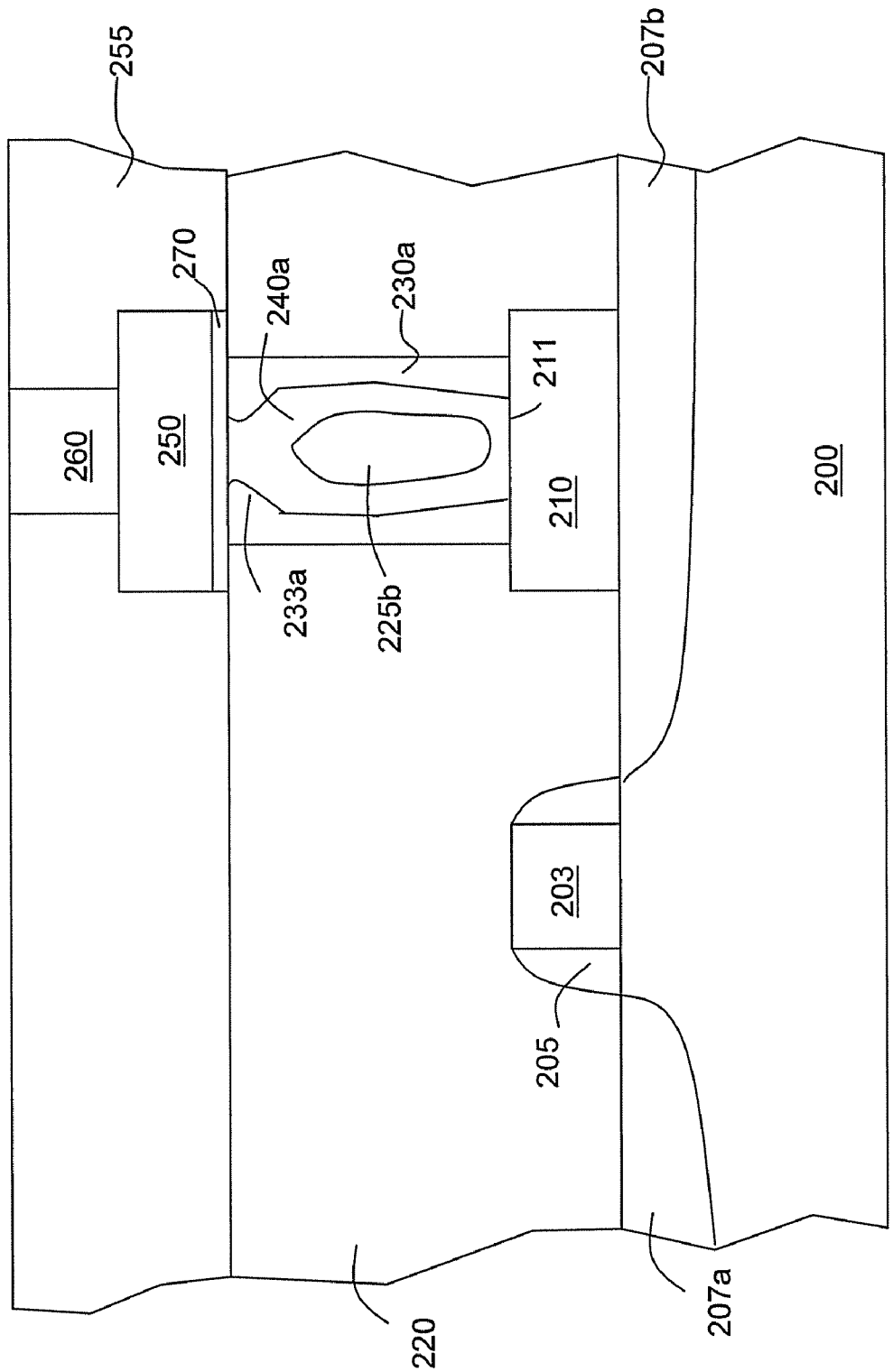

Referring to FIG. 2J, a glue layer 270 is formed between the conductive layer 240a and the PCM layer 250. The glue layer 270 is provided to enhance the adhesion between the conductive layer 240a and the PCM layer 250. The glue layer 270 may comprise, for example, Ti/TiN layers, Ta/TaN layers, or the like or combinations thereof. In some embodiments using 0.13-μm technology, the glue layer 265 may have a thickness between about 50 Å and about 100 Å. The glue layer 270 may be formed by, for example, a PVD process.

Figure 2K:
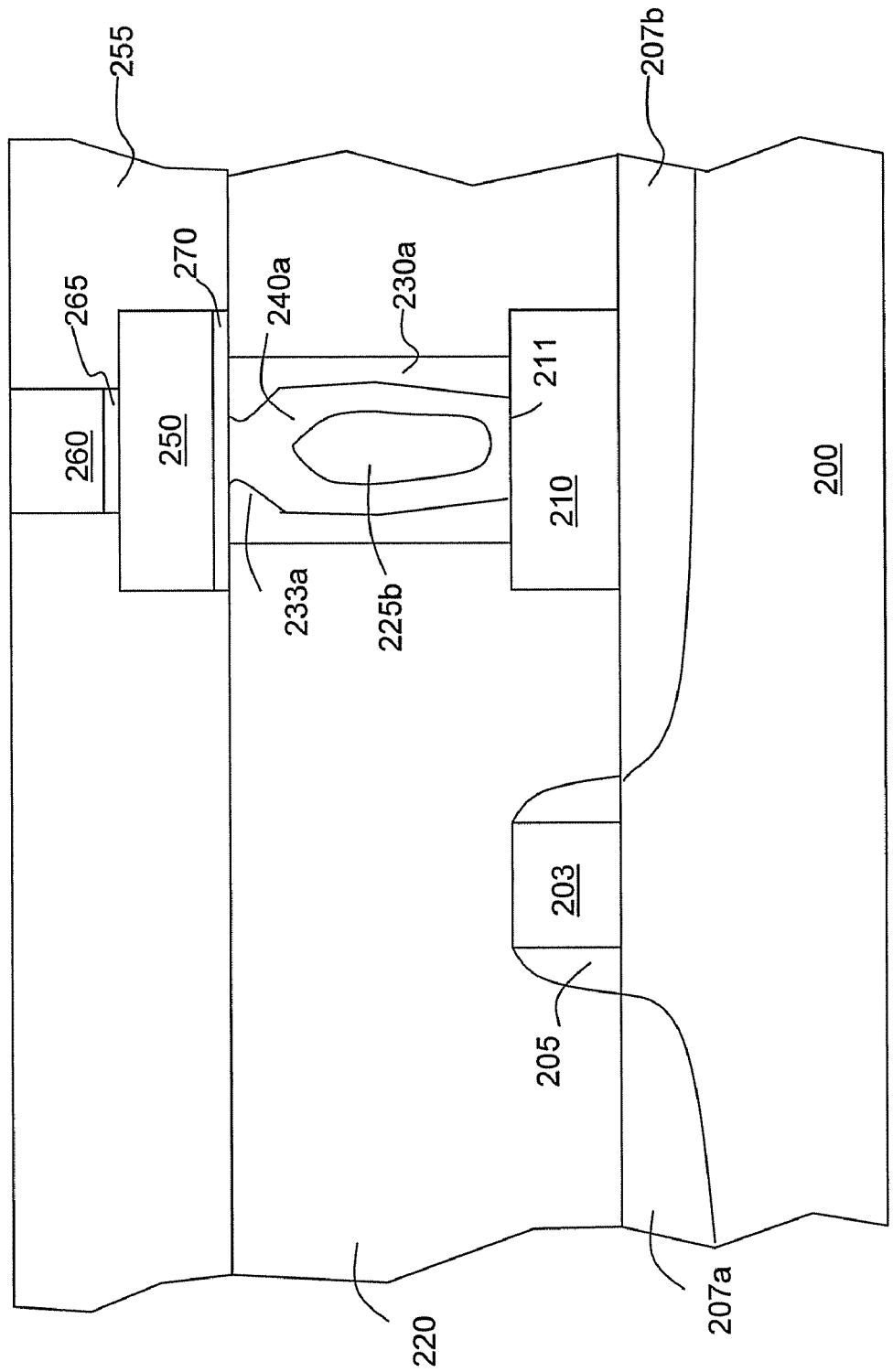

In some embodiments, a PCM cell may comprise the glue layers 265 and 270 as shown in FIG. 2K.

Figure 2L:
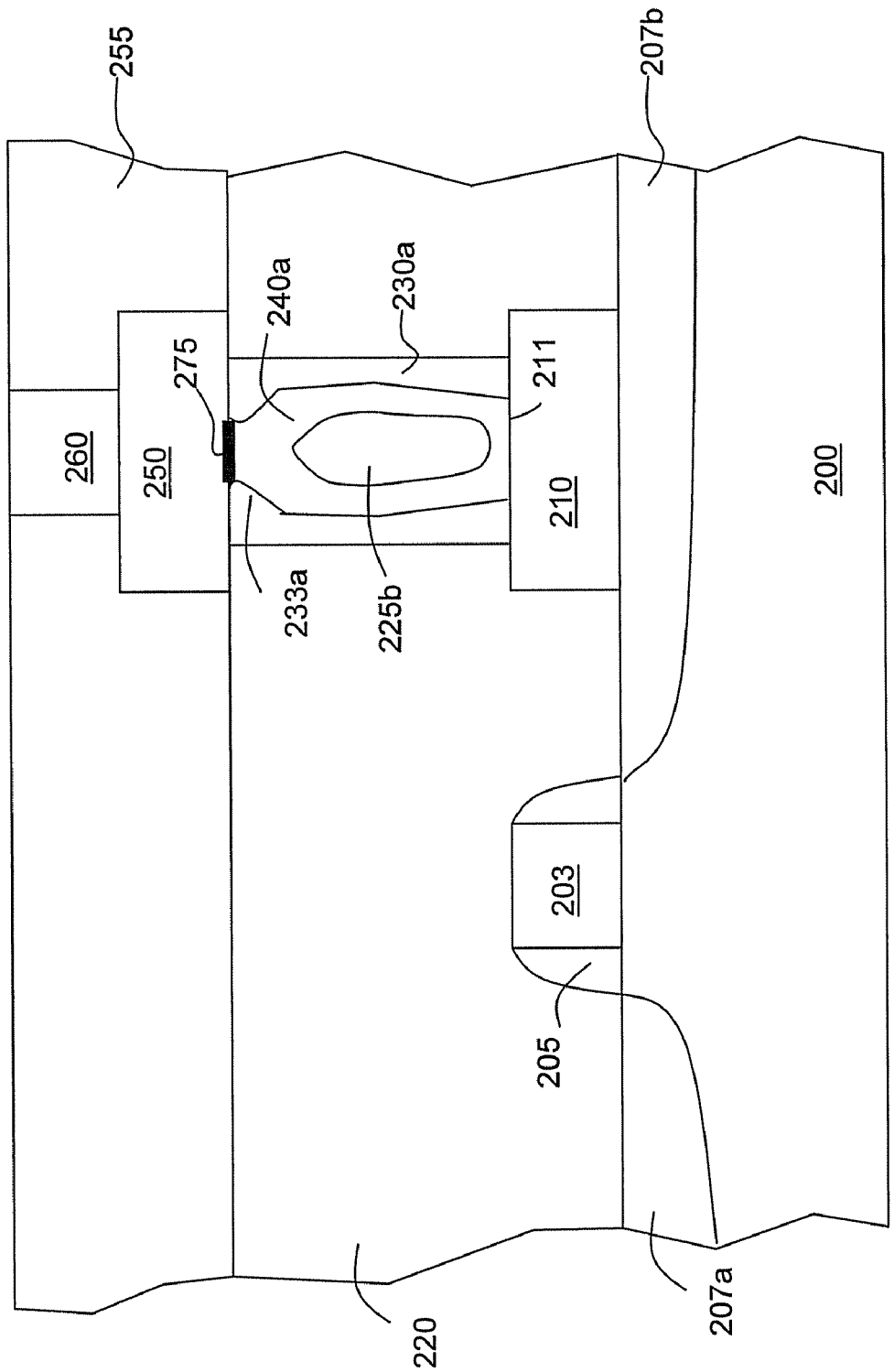

Referring to FIG. 2L, a glue layer 275 is formed on the conductive layer 240a. The glue layer 275 is provided to enhance the adhesion between the conductive layer 240a and the PCM layer 250. The glue layer 275 may comprise, for example, a silicide layer. The process for forming the glue layer 275 may comprise, for example, forming a metallic layer (not shown) over the structure shown in FIG. 2F, contacting the top surface of the conductive layer 240a. The metallic layer (not shown) may substantially interact with the conductive layer 240a, but does not substantially interact with the top surfaces of the dielectric layer 220 and spacers 230a. A removal process such as a wet etch process may be used to remove the portion of the non-interacted metallic layer (not shown) formed over the top surfaces of the dielectric layer 220 and spacers 230a. Accordingly, the glue layer 275 may be substantially formed on the top surface of the conductive layer 240a.

Figure 2M:
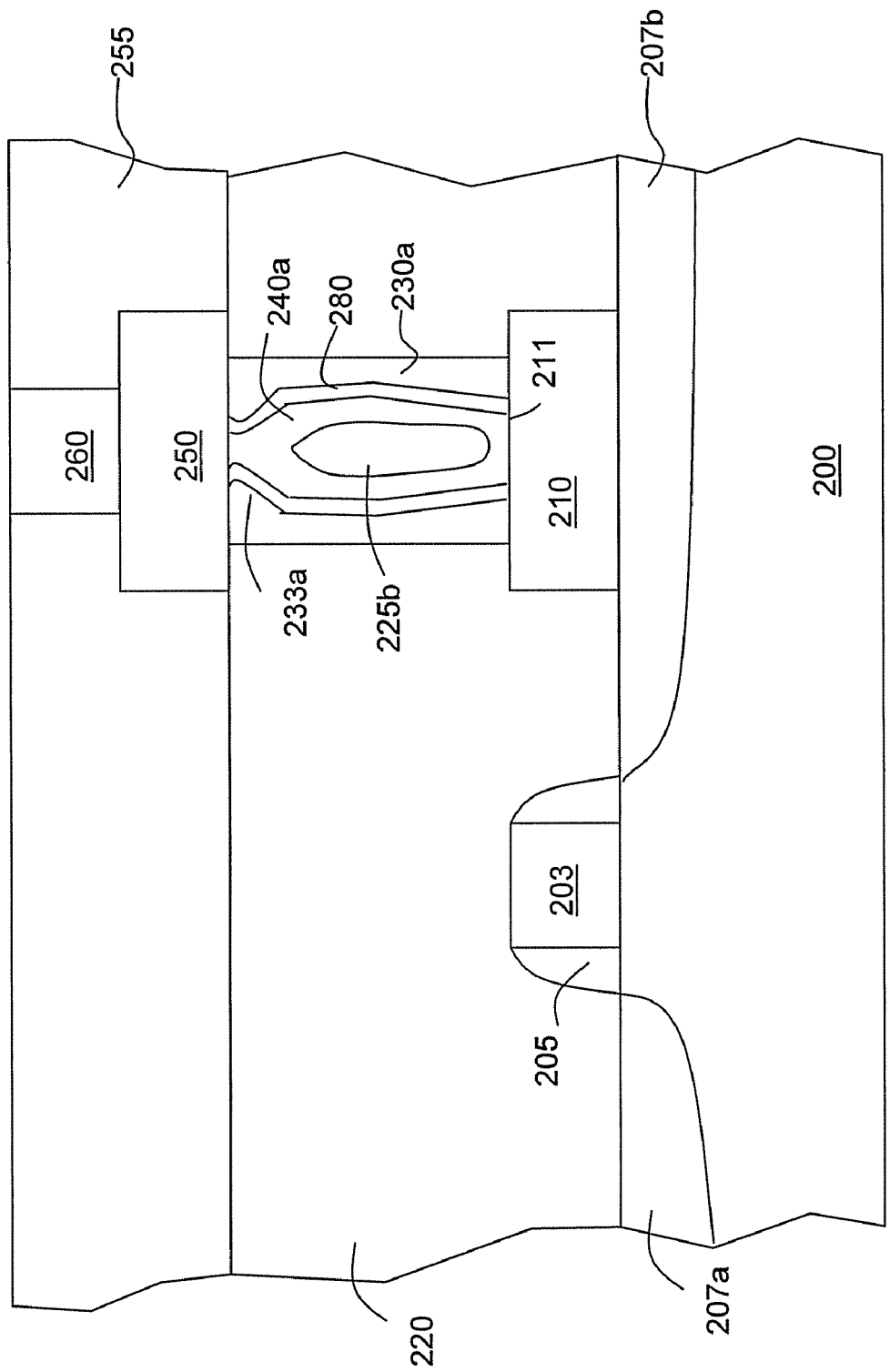

Referring to FIG. 2M, a barrier layer 280 may be formed between the spacers 230a and the conductive layer 240a. The barrier layer 280 is provided to prevent diffusion of constituents of the conductive layer 240 to the spacers 230a and/or the dielectric layer 220. In some embodiments, the barrier layer 280 may comprise, for example, Ti/TiN layers, Ta/TaN layers, or the like or combinations thereof. In some embodiments using 0.13-μm technology, the barrier layer 280 may have a thickness between about 50 Å and about 100 Å. The barrier layer 265 may be formed by, for example, a PVD process.

Figure 2N:
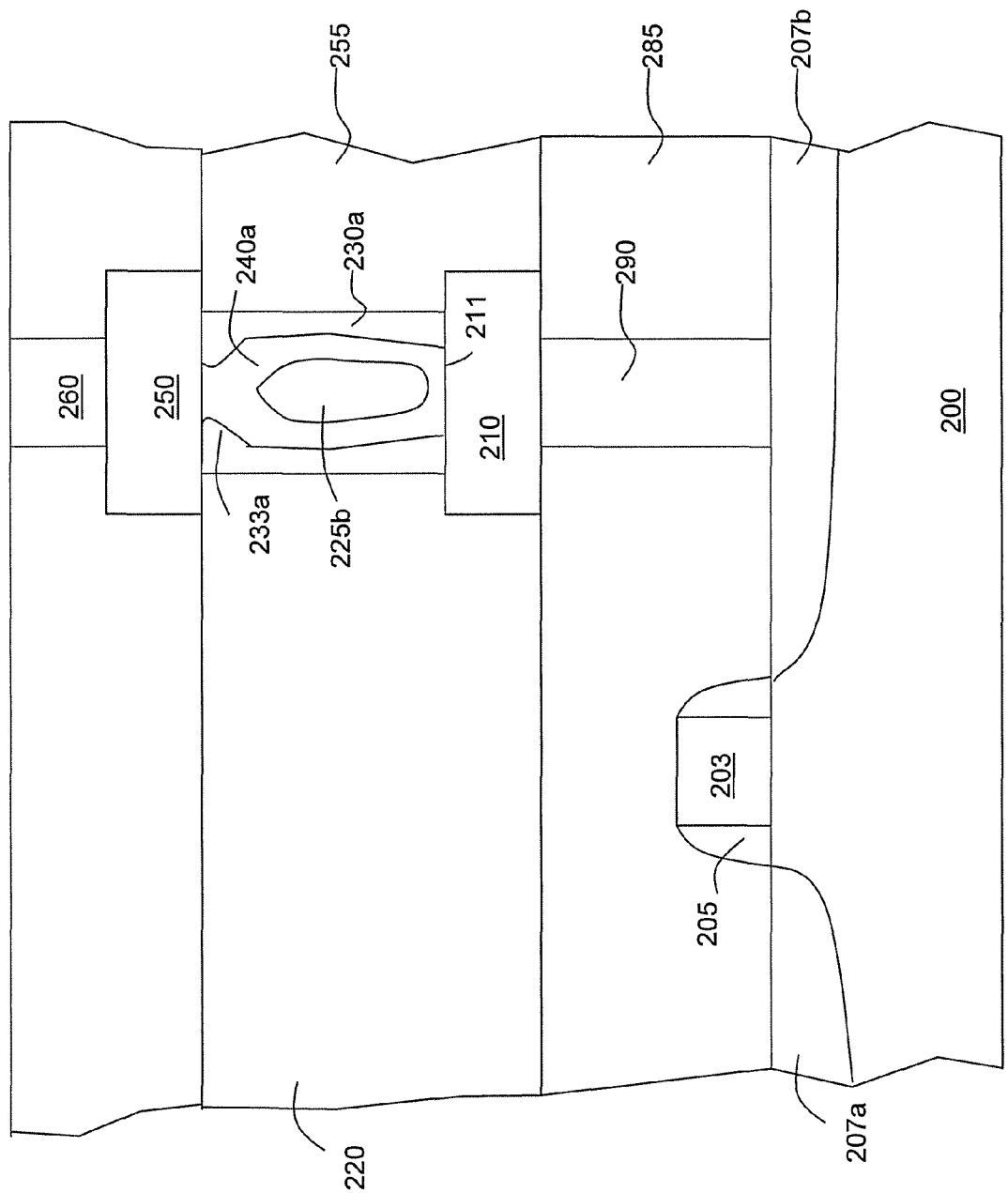

Referring to FIG. 2N, a conductive layer 290 may be formed between the contact region 207b and the conductive layer 210 for electrical connection. In some embodiments, the conductive layer 290 is formed within a dielectric layer 285. The dielectric layer 285 may comprise a material comprising at least one of oxide, nitride, oxynitride, low-k material, ultra-low-k dielectric or other dielectric material or combinations thereof. The dielectric layer 285 may be formed, for example, a plasma-enchanced CVD (PECVD) process, a spin-on-glass (SOG) process, an undoped silicate glass (USG) process or other process that is adequate to form a dielectric layer or combinations thereof.

In some embodiments, the conductive layer 290 may comprise a material comprising at least one of polysilicon, Al, Cu, AlCu, AlSiCu, W, or other conductive material or combinations thereof. In some embodiments, the conductive layer 290 may be a conductive plug.

Figure 2O:
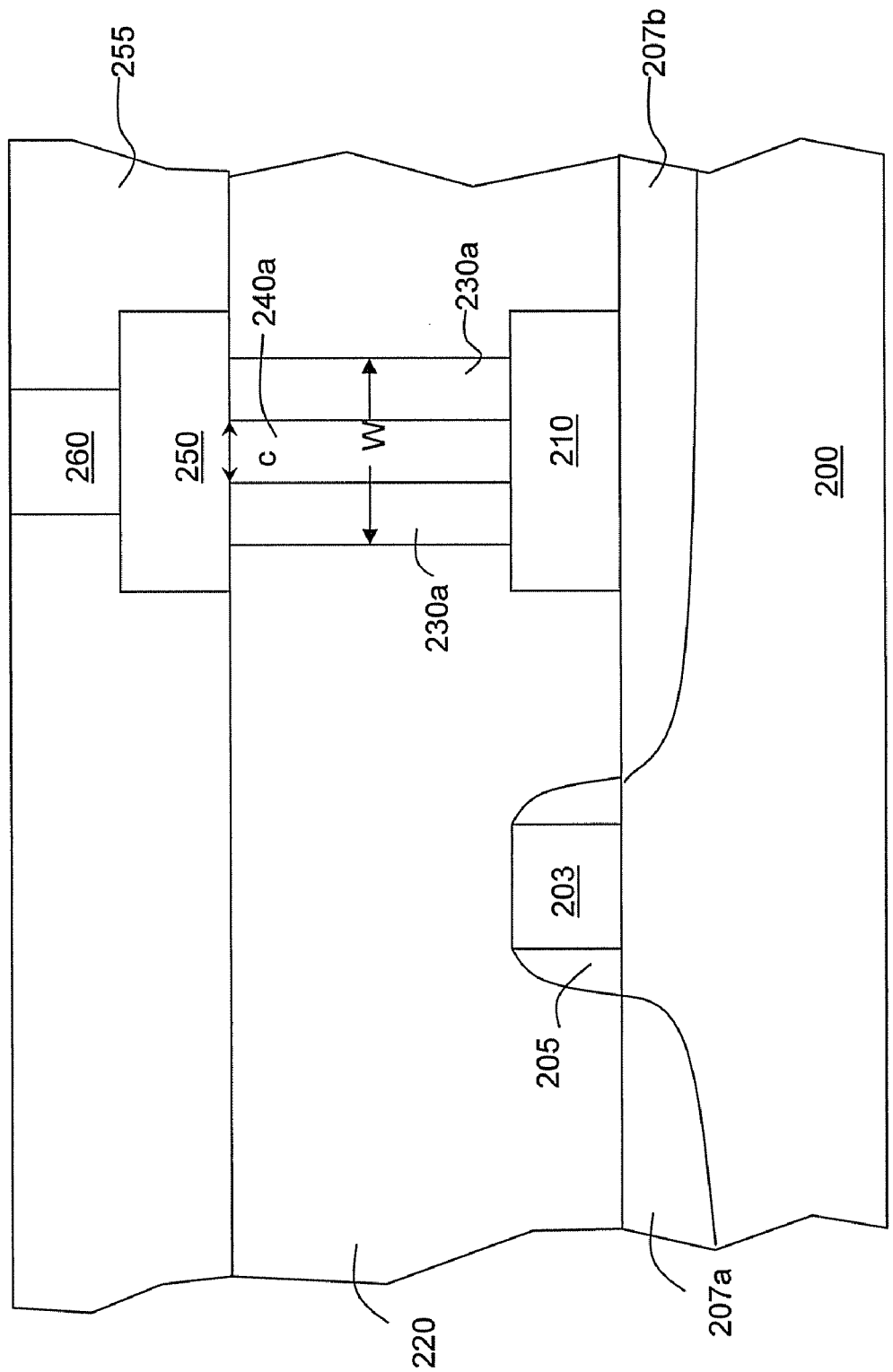

Referring to FIG. 2O, the spacers 230a are substantially conformal on the sidewalls (not labeled) of the dielectric layer 220. The conductive layer 240a is formed between the spacers 230a. The spacer 230a may have a top portion that may desirably reduce the exposed top surface of the conductive layer 240a. The top surface (not labeled) of the conductive layer 240a has a dimension "c" that is smaller than the width "W." In some embodiments, the conductive layer 240a may have a gap or slit (not shown) therein. In other embodiments, the conductive layer 240a is a bulk fill or plug.

Figure 3A:
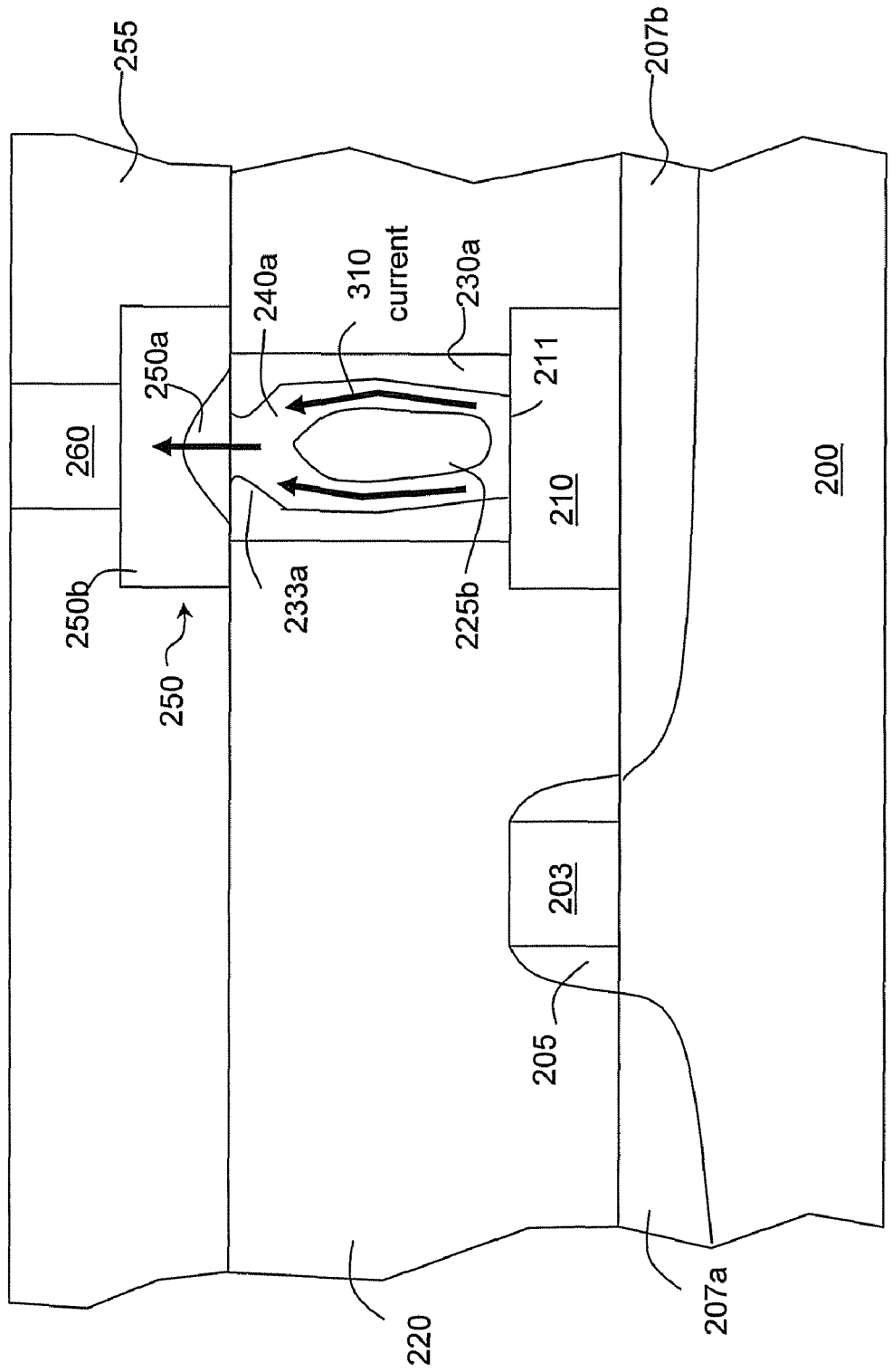
FIG. 3A is a schematic cross-sectional view showing programming or erasing a PCM cell.

FIG. 3A is a schematic cross-sectional view showing programming or erasing a PCM cell.

Referring to FIG. 3A, like items are indicated by reference numerals having the same value as in FIG. 2H. In order to program or erase the data stored in the PCM cell, a gate voltage is applied to the gate 203 so as to generate a conductive channel (not shown) beneath the gate 203 and between the contact regions 207a, 207b. A voltage is then applied to the contact region 207a such that a current (not labeled) then flows from the contact region 207a across the channel (not shown) to the contact region 207b. The current 310 then flows through the conductive layer 210, the conductive layer 240a, the PCM layer 250 to the conductive layer 260.

In some embodiments, the current 310 flowing from the conductive layer 240a is a program/erase current and will heat the PCM layer 250 such that a PCM portion 250a is heated beyond its crystallization temperature (Tx) and/or melting temperature (Tm). In some embodiments, the current 310 substantially heats the whole PCM layer 250 beyond its crystallization temperature (Tx) and/or melting temperature (Tm). By activating the portion 250a of the PCM layer 250 or substantially the whole PCM layer 250, the PCM cell may be programmed or erased.

In some embodiments, when the PCM layer 250 (shown in FIG. 3A) is amorphous and has a high resistance, the data stored in the PCM cell may be defined as "0" because a read current (not shown) flowing through the conductive layer 240a, the PCM layer 250 and the conductive layer 260 is low. When the PCM layer 250 is crystalline and has a low resistance, the data stored in the PCM cell may be defined as "1" because a read current (not shown) flowing through the conductive layer 240a, the PCM layer 250 and the conductive layer 260 is high. In still other embodiments, an amorphous PCM layer 250 and a crystalline PCM layer 250 may be alternatively defined as data "1" and data "0," respectively.

Referring again to FIG. 3A, the current 310 is provided to at least partially activate the PCM layer 250 such that the activated PCM portion 250a may cover the top surface (not labeled) of the conductive layer 240a. Compared with a current applied to heat the whole PCM layer 250, the current 310 merely heating the PCM portion 250a may be desirably reduced. Accordingly, the power consumed to heat the PCM portion 250a to or beyond its crystallization temperature (Tx) and/or melting temperature (Tm) may be desirably low.

In some embodiments, the conductive layer 240a of a PCM cell is formed within the dielectric layer 220 without the spacers 230a between the conductive layer 240a and the dielectric layer 220. Without the spacers 230a to reduce the top surface of the conductive layer 240a, the dimension of the conductive layer 240a is the width "W" of the opening 225 (shown in FIG. 2B). Unlike the PCM cell without the spacers 230a, the PCM cell shown in FIG. 3A includes the spacers 230a in order to reduce the top surface of the conductive layer 240a. The conductive layer 240a has a dimension "c" smaller than the dimensions "W" of the conductive layer of the PCM cell without the spacers 230a. Compared with a current applied to heat the PCM cell without the spacers 230a, the current 310 and/or power applied to the heat the PCM cell shown in FIG. 3A can be desirably reduced.

FIGS. 3B and 3C are schematic equivalent circuits of exemplary PCM capacitors.

Referring to FIGS. 3B and 3C, $R_{contact}$ top represents the resistance of the conductive layer 260; $R_{amorphous}$ represents the resistance of an amorphous PCM layer 250; $R_{crystal}$ represents the resistance of a crystal PCM layer 250 $R_{sidewall}$ represents the resistance of one side of the conductive layer 240a; and $R_{contact,\ bottom}$ represents the resistance of the conductive layer 210a.

The total resistance R1 of the equivalent circuit shown in FIG. 3B may be equal to $R_{contact,\ top}+R_{amorphous}+\frac{1}{2}R_{sidewall}+R_{contact,\ bottom}$, and the total resistance R2 of the equivalent circuit shown in FIG. 3C may be equal to $R_{contact,\ top}+R_{crystal}+\frac{1}{2}R_{sidewall}+R_{contact,\ bottom}$. Since $R_{amorphous}$ may be as high as thousands of times the value of $R_{crystal}$, R1 will be desirably larger than R2. Accordingly, the same voltage coupled to the equivalent circuits of FIGS. 3B and 3C may generate different read currents.

Following are descriptions of exemplary programming and erasing processes of the PCM cell.

Figure 3D:
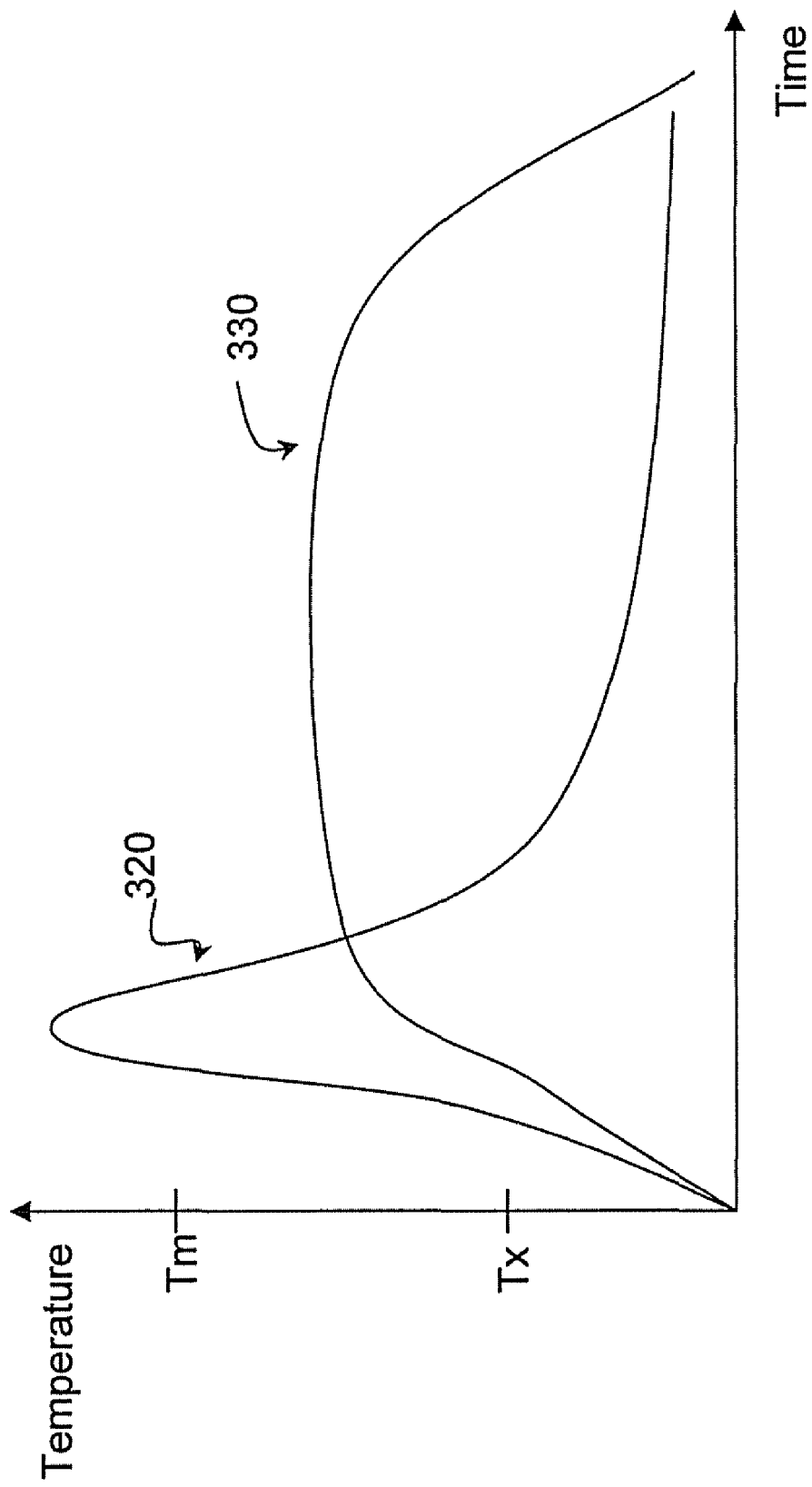
FIG. 3D is a graph showing exemplary curves for programming a PCM cell from data "0" to data "1" and erasing a PCM cell from data "1" to data "0."

FIG. 3D is a graph showing exemplary curves for programming a PCM cell from "0" to "1" and erasing a PCM cell from "1" to "0."

I. Erasing an PCM Cell from "1" to "0"

As described above, an amorphous PCM layer 250 may represent data "0" and a crystal PCM layer 250 may represent data "1."

In order to erase the PCM cell from data "1" to data "0," an erasing current such as the current 310 (shown in FIG. 3A) is provided to the PCM layer 250. The erasing current 310 may heat the PCM layer 250 up to or beyond its melting temperature Tm (e.g., about 632° C.) so as to at least partially amorphousize the crystalline PCM layer 250. After the melting step, the amorphousized PCM portion 250a is quenched down to or below its crystallization temperature Tx (e.g., between about 140° C. and about 170° C.) as shown in the curve 320 of FIG. 3D. In some embodiments, the time for quenching the amorphousized PCM portion 250a from its Tm to Tx is about 30 nanoseconds (ns) or less. Since the quenching rate is so fast or the quenching time is so short, the amorphousized PCM portion 250a may not have enough time to crystallize and may remain in the amorphous state. The amorphousized PCM portion 250a may substantially increase the resistance of the PCM layer 250. Accordingly, the combined resistances of the amorphousized PCM portion 250a and the remaining crystalline PCM portion 250b will be substantially higher than a pure crystalline PCM layer 250. A read current flowing through the amorphousized PCM portion 250a and the remaining crystalline PCM portion 250b may be substantially reduced. Accordingly, the PCM cell is erased from data "1" to data "0."

II. Programming an PCM Cell from Data "0" to "1"

As described above, an amorphous PCM layer 250 may represent data "0" and a crystal PCM layer 250 may represent data "1."

In order to program the PCM cell from data "0" to data "1," a programming current such as the current 310 (shown in FIG. 3A) is provided to the amorphous PCM layer 250. The programming current 310 may heat the amorphous PCM layer 250 up to or beyond its Tx (e.g., between about 140° C. and about 170° C.). Since the PCM layer 250 is amorphous, the programming current 310 may provide a desired energy for crystallization. After the heating process, the temperature of the heated PCM layer 250 is maintained for about 100 ns so as to crystallize the heated PCM layer 250 as shown in the curve 330 of FIG. 3D. Then, the heated PCM layer 250 may be cooled down below its Tx and crystallized. The crystallized PCM layer 250 may have the resistance substantially lower from that of the original amorphous PCM layer 250. Accordingly, a read current flowing through the crystallized PCM layer 250 may be substantially high than that of the amorphous PCM layer. Accordingly, the amorphous PCM cell is programmed from data "0" to data "1."

FIGS. 4A-4D are schematic cross-sectional views showing exemplary steps for forming an exemplary PCM capacitor. In FIGS. 4A-4D, like items are indicated by the reference numerals having the same value as shown in FIGS. 2A-2G.

Figure 4A:
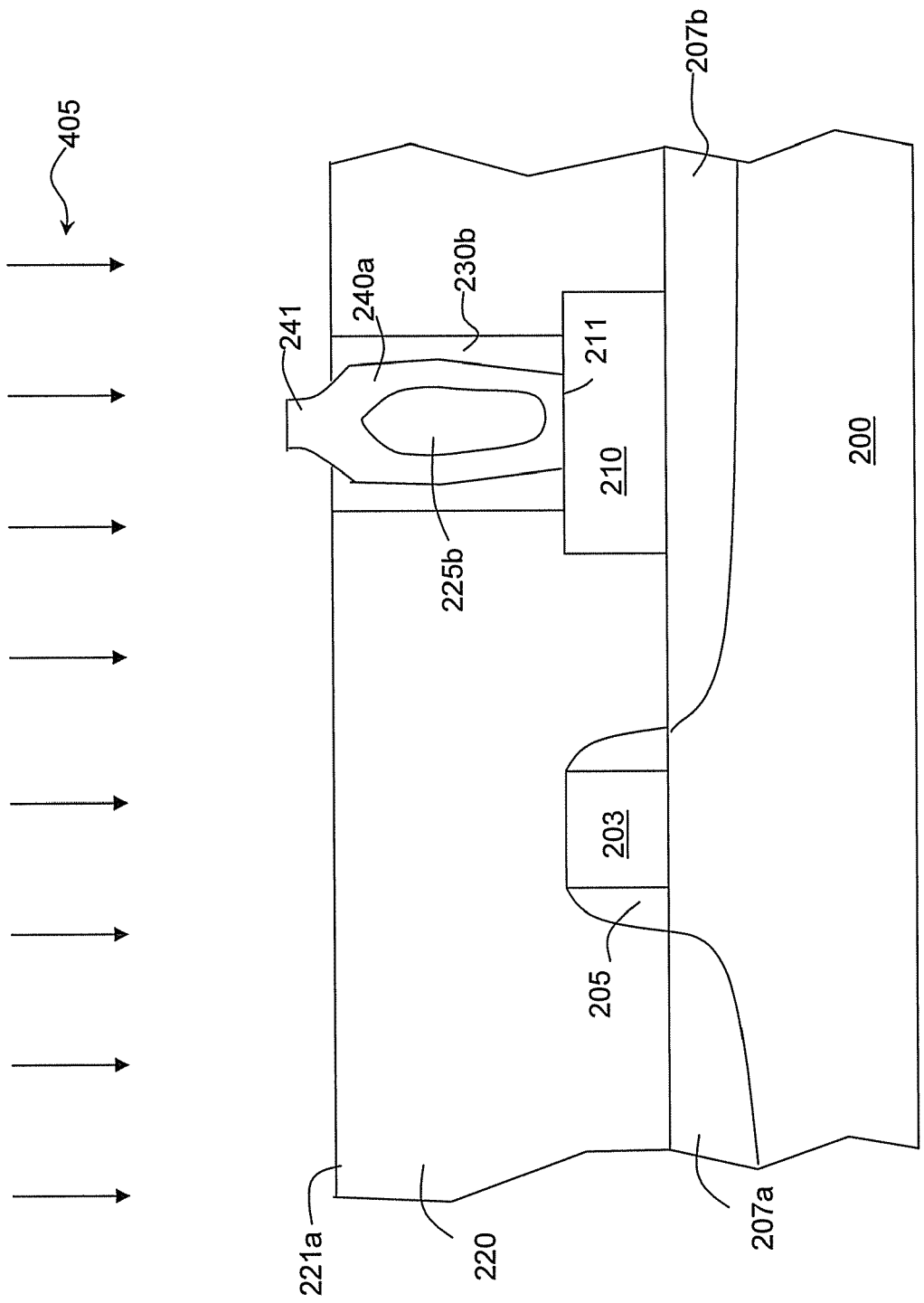
FIGS. 4A-4D are schematic cross-sectional views showing exemplary steps for forming an exemplary PCM capacitor.

Referring to FIG. 4A, after the removal step 243 (shown in FIG. 2F), an etch step 405 may remove a portion of the dielectric layer 220 and a portion of the spacers 230, such that a cap region 241 of the conductive layer 240a is formed above a top surface 221a of the dielectric layer 220. The etch step 405 may be, for example, a dry etch process. In some embodiments, the etch step 405 may have a desired etching selectivity of the conductive layer 240a to the dielectric layer 220 and/or the spacers 230b.

Figure 4B:
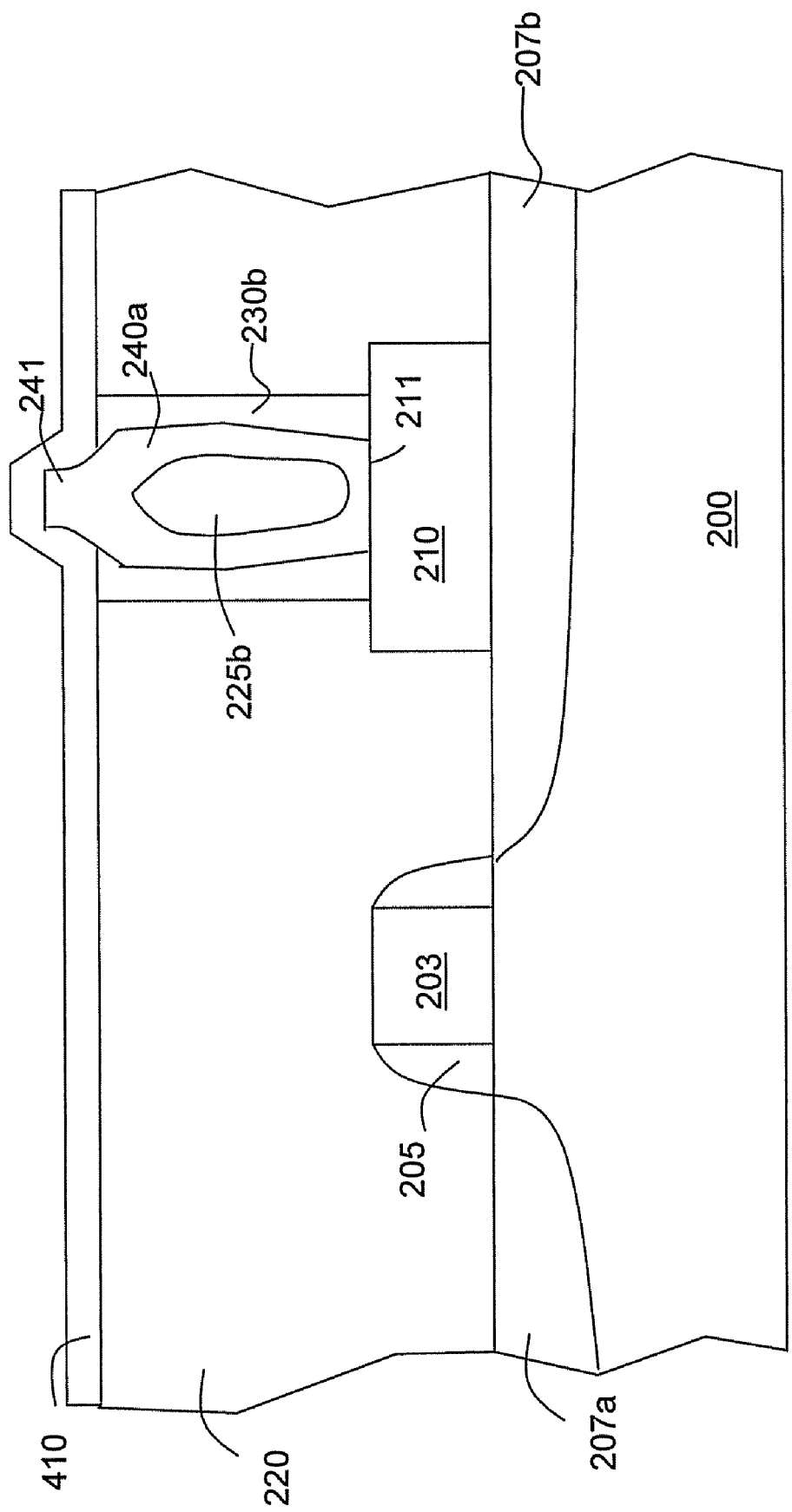

Referring to FIG. 4B, a dielectric layer 410 may be formed over the cap region 241 of the conductive layer 240a. The dielectric layer 410 may comprises at least one of a tantalum oxide ($Ta_2O_5$) layer, a germane nitride (GeN) layer, a tantalum oxynitride (TaON) layer, an aluminum oxide ($Al_2O_3$) layer and other dielectric layer that has a low thermal conductivity. In some embodiments, the dielectric layer 410 may be formed by a CVD process. The dielectric layer 410 may be substantially conformal over the topography of the dielectric layer 220 and the cap region 241 of the conductive layer 240a.

Figure 4C:
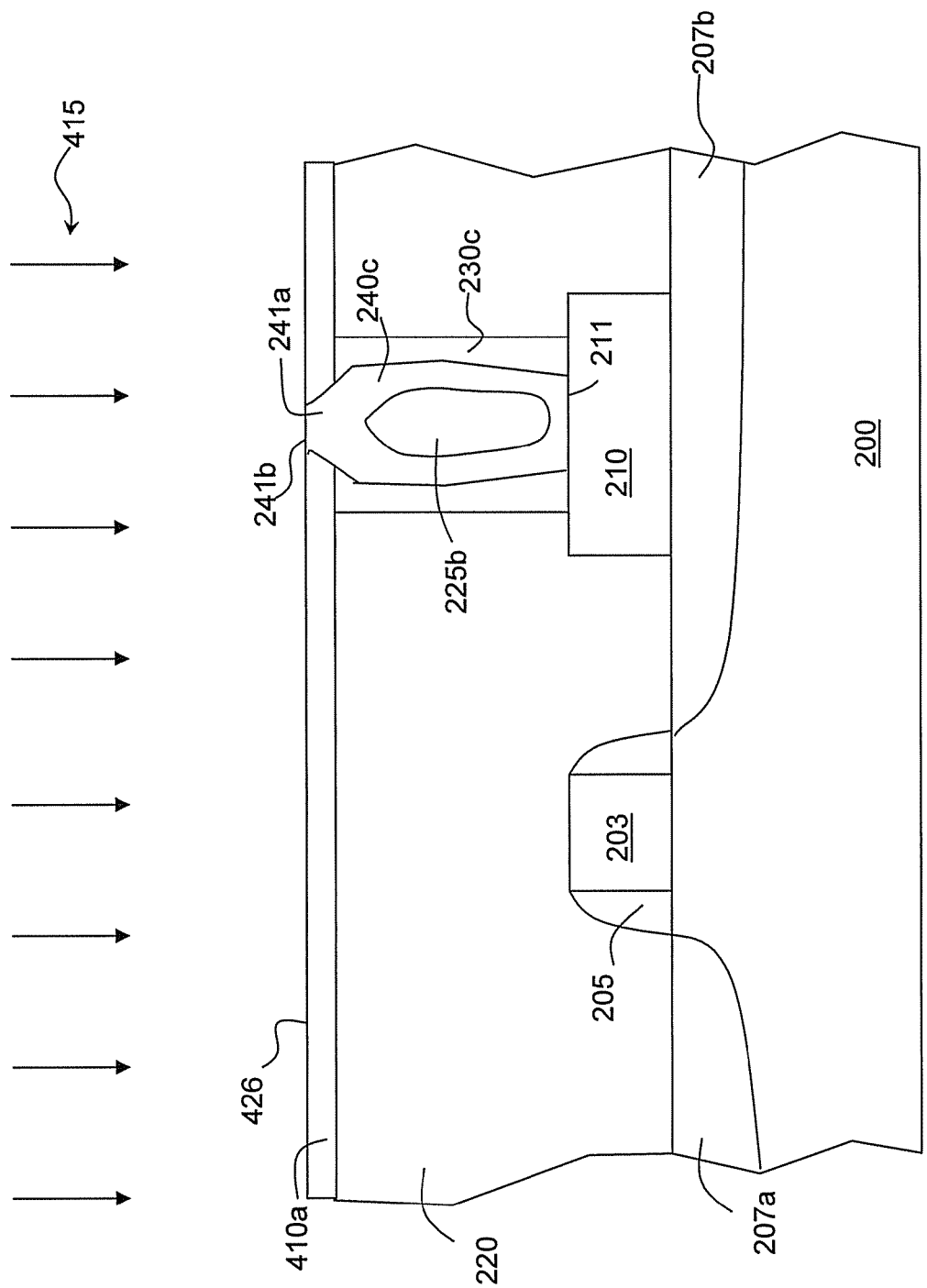

Referring to FIG. 4C, a removal step 415 may remove a portion of the dielectric layer 410 and the cap region 241 so as to form the dielectric layer 410a and the cap region 241a. In some embodiments, the top surface 411 of the dielectric layer 410a may be substantially level with the top surface 241b of the cap region 241a.

Figure 4D:
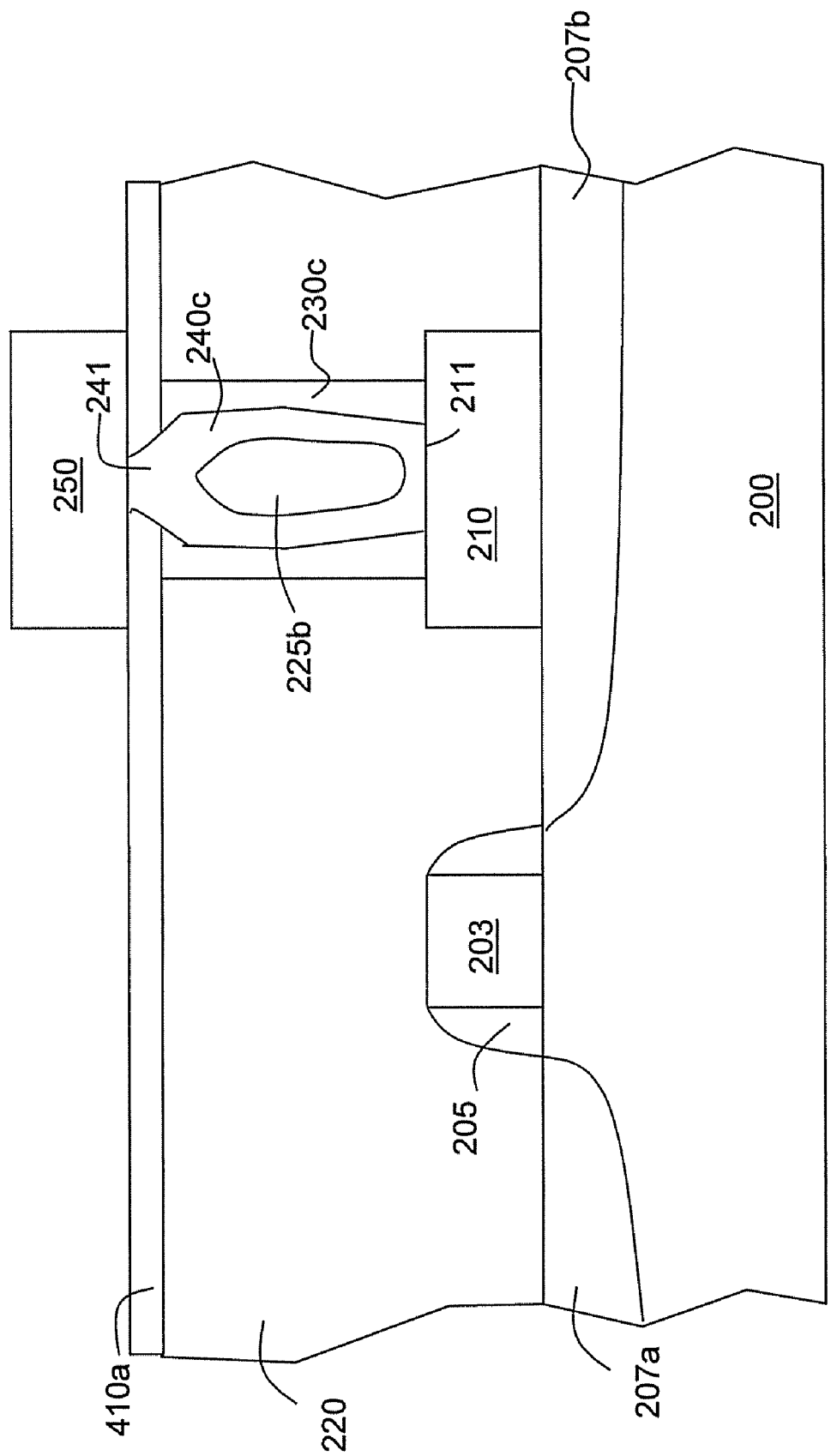

Referring to FIG. 4D, a PCM layer 250 is formed over the conductive layer 240c. After the formation of the PCM layer 250, processing steps described in conjunction with FIGS. 2H-2O may be cooperated with the steps set forth above in connection with FIGS. 4A-4D.

Referring again to FIG. 4D, a current (not shown) may be applied to the PCM layer 250 through the conductive layer 240c for at least partially transforming the PCM layer 250. During the transformation, heat is generated within the PCM layer 250. Since the dielectric layer 410a has a desired low thermal conductivity, heat generated in the PCM layer 250 would be prevented from transmitting into the dielectric layer 220 or the dielectric spacers 230c and may desirably remain in the PCM layer 250, such that the PCM layer 250 may be desirably transformed.

FIGS. 4E-4H are schematic cross-sectional views showing exemplary steps for forming an exemplary PCM capacitor. In FIGS. 4E-4H, like items are indicated by the reference numerals having the same value as shown in FIGS. 4A-4D.

Figure 4E:
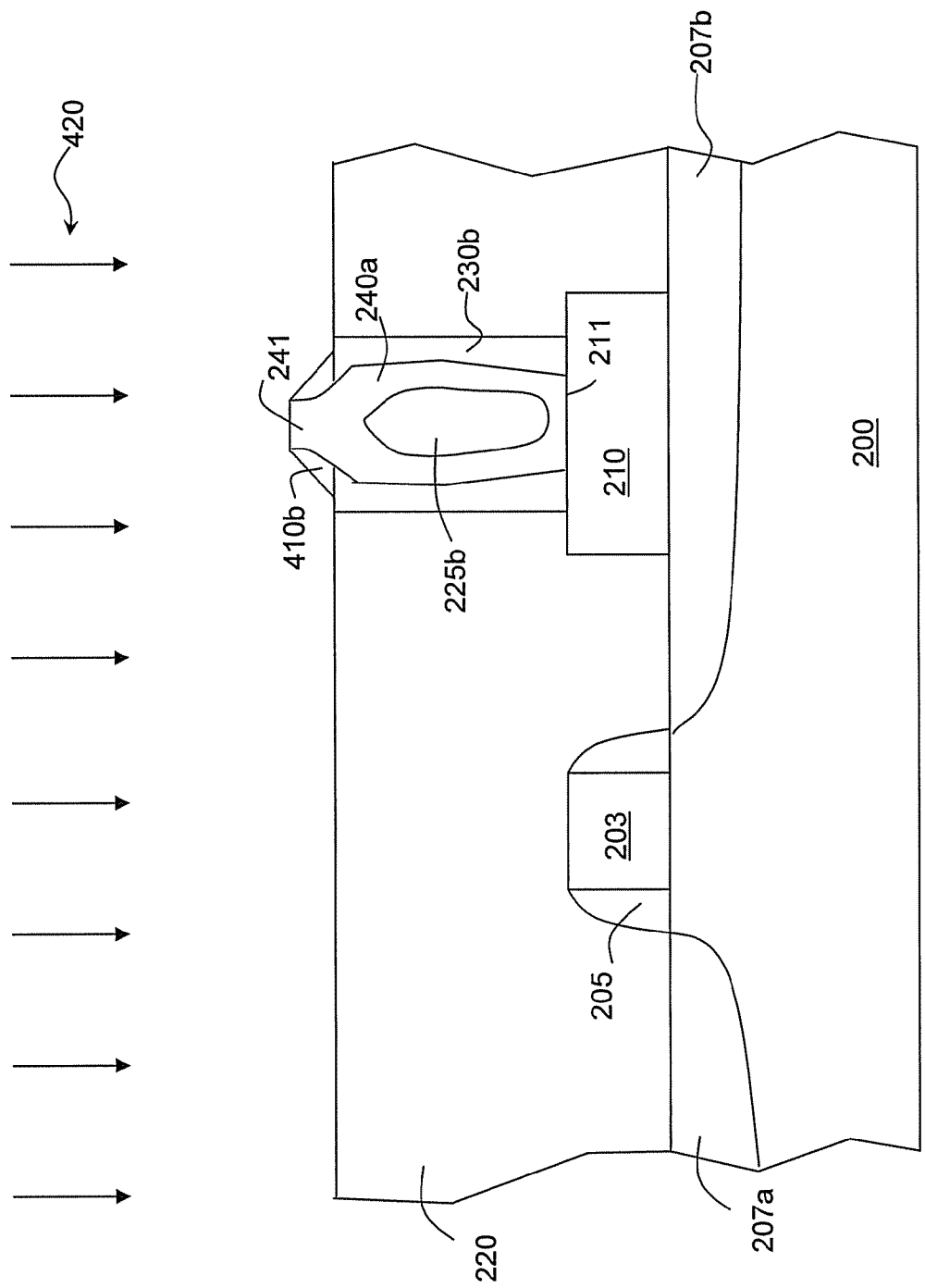
FIGS. 4E-4H are schematic cross-sectional views showing exemplary steps for forming an exemplary PCM capacitor.

Referring to FIG. 4E, after the formation of the dielectric layer 410 (shown in FIG. 4B), an etch step 420 may remove a portion of the dielectric layer 410 so as to form spacers 410b on sidewalls of the cap region 241 of the conductive layer 240a. The etch step 420 may be, for example, a dry etch process. In some embodiments, the etch step 420 may have a desired etching selectivity of the conductive layer 240a to the dielectric layer 410.

Figure 4F:
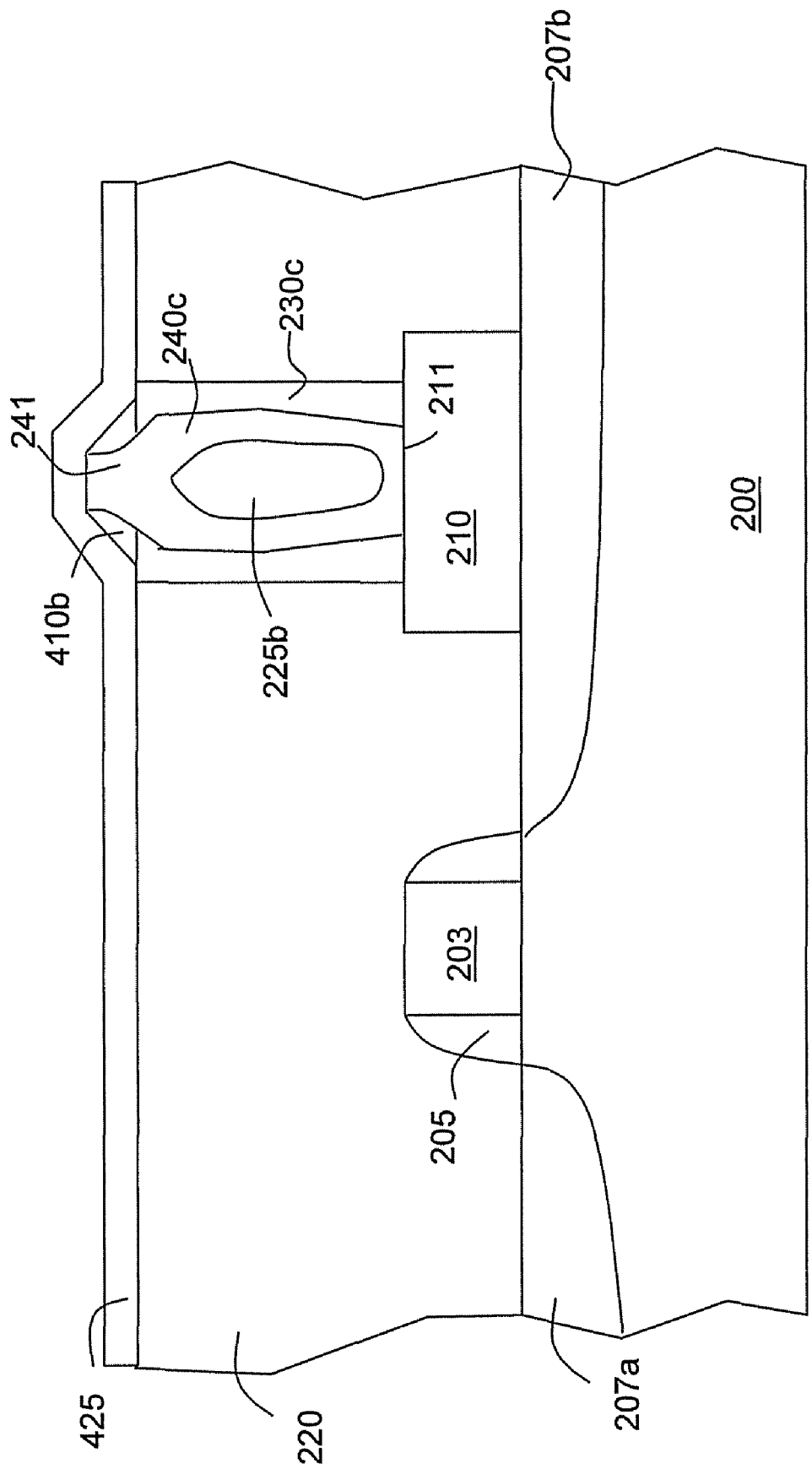

Referring to FIG. 4F, a dielectric layer 425 may be formed over the cap region 241 of the conductive layer 240a and the spacers 425b. The dielectric layer 425 may be, for example, an oxide layer, a nitride layer, an oxynitride layer, a tantalum oxide ($Ta_2O_5$) layer, a germane nitride (GeN) layer, a tantalum oxynitride (TaON) layer, an aluminum oxide ($Al_2O_3$) layer, other dielectric layer or a multi-layer structure comprising various combinations thereof. In some embodiments, the dielectric layer 425 may be formed by a CVD process. The dielectric layer 425 may be substantially conformal over the topography of the dielectric layer 220, the spacers 410b and the cap region 241 of the conductive layer 240a.

Figure 4G:
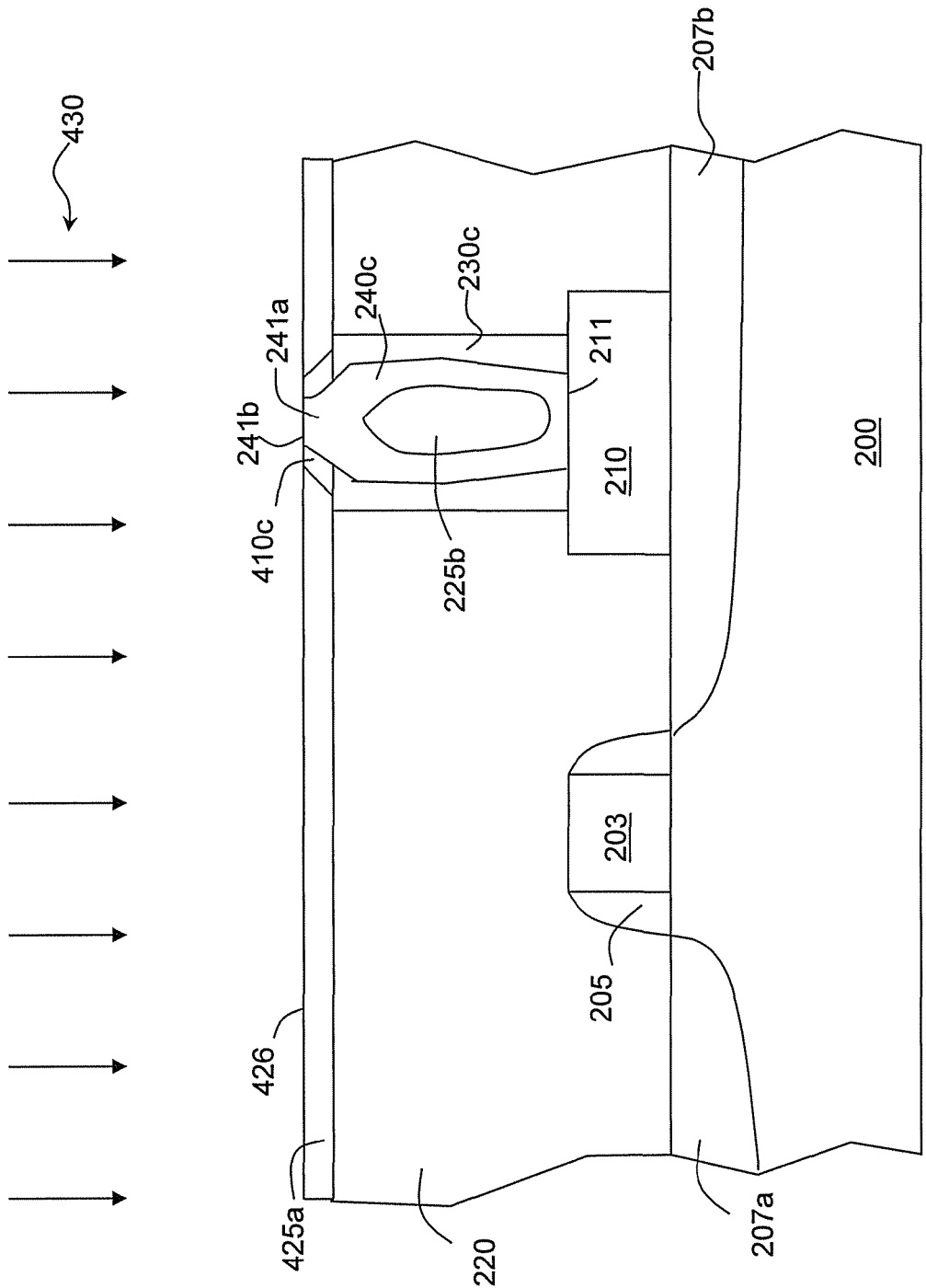

Referring to FIG. 4G, a removal step 430 may remove a portion of the dielectric layer 425, the spacers 410b and the cap region 241 so as to form the dielectric layer 425a, the spacers 410c and the cap region 241a. In some embodiments, the top surface 426 of the dielectric layer 425a may be substantially level with the top surface 241b of the cap region 241a.

Figure 4H:
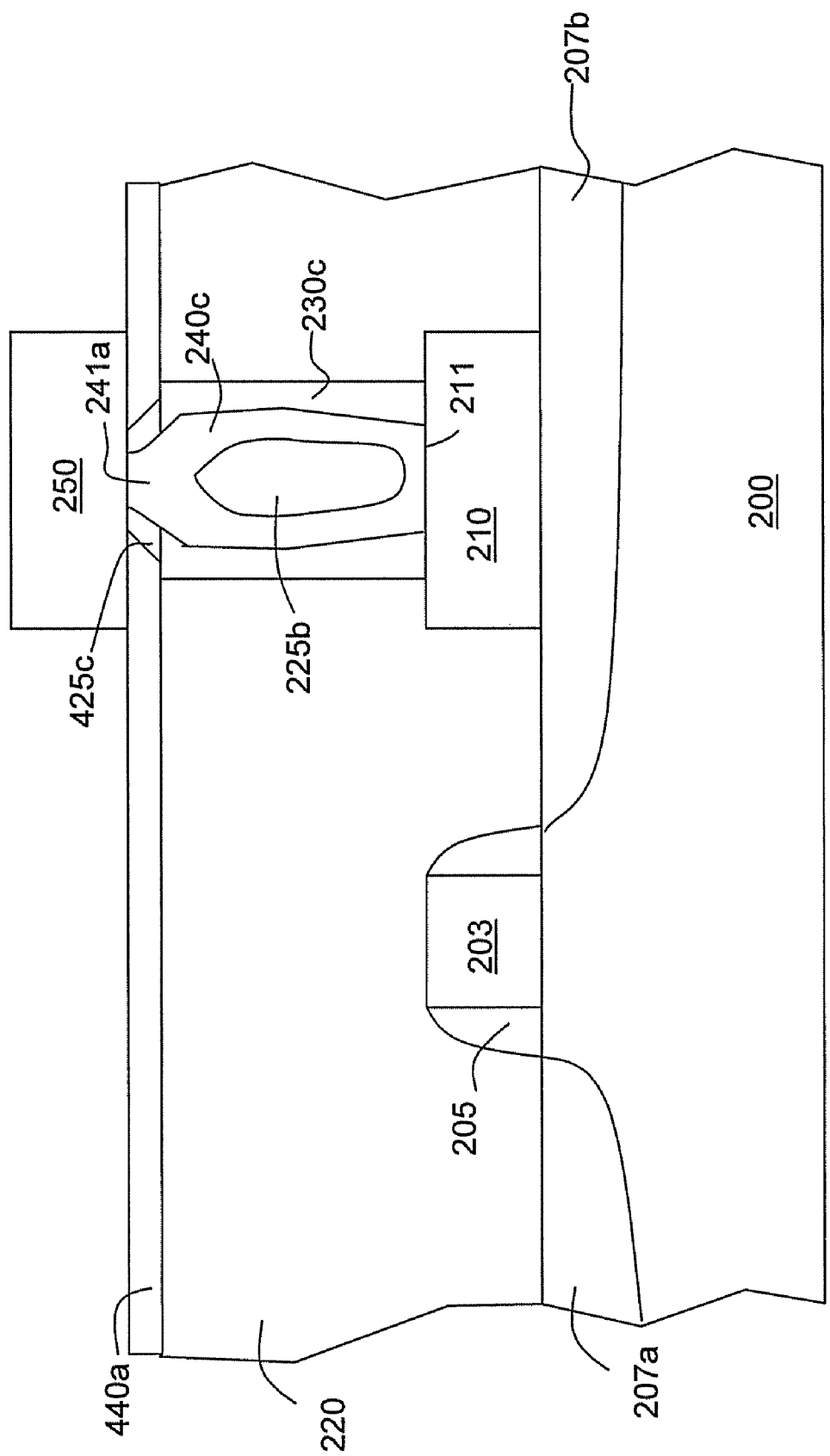

Referring to FIG. 4H, a PCM layer 250 is formed over the conductive layer 240c. After the formation of the PCM layer 250, processing steps described in conjunction with FIGS. 2H-2O may be cooperated with the steps set forth above in connection with FIGS. 4E-4H.

Referring again to FIG. 4H, a current (not shown) may be applied to the PCM layer 250 through the conductive layer 240c for at least partially transforming the PCM layer 250. During the transformation, heat is generated within the PCM layer 250. Since the dielectric spacers 410c and/or the dielectric layer 425a have a desired low thermal conductivity, heat generated in the PCM layer 250 would be prevented from transmitting into the dielectric layer 220 or the dielectric spacers 230c and may desirably remain in the PCM layer 250, such that the PCM layer 250 may be desirably transformed.

Although the present invention has been described in terms of exemplary embodiments, it is not limited thereto. Rather, the appended claims should be construed broadly to include other variants and embodiments of the invention which may be made by those skilled in the field of this art without departing from the scope and range of equivalents of the invention.

What is claimed is:

1. A semiconductor structure, comprising:
a transistor over a substrate, the transistor comprising a gate and a contact region adjacent to the gate and within the substrate;
a first conductive layer over the contact region;
a first dielectric layer over the first conductive layer;
a second conductive layer within the first dielectric layer, contacting at least a portion of a top surface of the first conductive layer, the second conductive layer comprising a tapered cap portion extending above an uppermost surface of the first dielectric layer;
at least one first dielectric spacer between the first dielectric layer and the second conductive layer;
a phase change material layer above a top surface of the second conductive layer;
a third conductive layer over the phase change material layer;
a second dielectric layer formed over the first dielectric layer, such that the phase change material is separated from the first dielectric layer and the first dielectric spacer by the second dielectric layer; and
at least one second dielectric spacer on a sidewall of the cap portion such that the tapered cap portion is completely separated from the second dielectric layer by the second dielectric spacer, wherein a thermal conductivity of the second dielectric spacer is less than a thermal conductivity of the first dielectric layer or a thermal conductivity of the second dielectric layer,
wherein a top surface of the second dielectric spacer is substantially level with top surfaces of the tapered cap portion and the second dielectric layer.

2. The semiconductor structure of claim 1, wherein the second conductive layer seals a gap within the first dielectric layer.

3. The semiconductor structure of claim 1 further comprising a glue layer between the phase change material layer and the third conductive layer.

4. The semiconductor structure of claim 1 further comprising a glue layer between the phase change material layer and the second conductive layer.

5. The semiconductor structure of claim 4, wherein the glue layer overlies the second conductive layer substantially without overlying over the first dielectric spacer.

6. The semiconductor structure of claim 1 further comprising at least one barrier layer between the first dielectric spacer and the second conductive layer.

7. The semiconductor structure of claim 1, wherein the first dielectric spacer has a height (L), the first dielectric spacer and the second conductive layer have a width (W), and a ratio of the height to the width (L/W) is between about 0.25 to about 5.

8. The semiconductor structure of claim 1 further comprising a fourth conductive layer between the contact region and the first conductive layer.

9. The semiconductor structure of claim 1, wherein a top portion of the first dielectric spacer is thicker than a middle portion of the first dielectric spacer.

10. The semiconductor structure of claim 1, wherein the first and second dielectric layers are formed of different materials.

11. A semiconductor structure, comprising:
a transistor over a substrate, the transistor comprising a gate and a contact region adjacent to the gate and within the substrate;
a first conductive layer over the contact region;
a first dielectric layer over the first conductive layer;
a second conductive layer within the first dielectric layer, contacting at least a portion of a top surface of the first conductive layer, wherein the second conductive layer seals a gap within the first dielectric layer;
at least one first dielectric spacer between the first dielectric layer and the second conductive layer, wherein a top portion of the first dielectric spacer is thicker than a middle portion of the first dielectric spacer;
a phase change material layer over a top surface of the second conductive layer;
a third conductive layer over the phase change material layer; and
a second dielectric layer formed over the first dielectric layer,
wherein the second conductive layer comprises a tapered cap portion extending above an uppermost surface of the first dielectric layer, the tapered cap portion completely separated from the second dielectric layer by a second dielectric spacer having a thermal conductivity being less than a thermal conductivity of the first dielectric layer or a thermal conductivity of the second dielectric layer.

12. The semiconductor structure of claim 11, wherein the second dielectric layer comprises at least one of a tantalum oxide (Ta2O5) layer, a germane nitride (GeN) layer, a tantalum oxynitride (TaON) layer and an aluminum oxide (Al2O3) layer, and is formed of a different material than the first dielectric layer.

13. The semiconductor structure of claim 11 further comprising a glue layer between the phase change material layer and the third conductive layer.

14. The semiconductor structure of claim 11 further comprising a glue layer between the phase change material layer and the second conductive layer.

15. The semiconductor structure of claim 14, wherein the glue layer overlies the second conductive layer substantially without overlying the first dielectric spacer.

16. The semiconductor structure of claim 11 further comprising at least one barrier layer between the first dielectric spacer and the second conductive layer.

17. The semiconductor structure of claim 11, wherein the first dielectric spacer has a height (L), the first dielectric spacer and the second conductive layer have a width (W), and a ratio of the height to the width (L/W) is between about 0.25 to about 5.

18. The semiconductor structure of claim 11 further comprising a fourth conductive layer between the contact region and the first conductive layer.

19. The semiconductor structure of claim 11, wherein a top surface of the second dielectric spacer is substantially level with top surfaces of the tapered cap portion and the second dielectric layer.

20. The semiconductor structure of claim 11, wherein the second conductive layer comprises conductive material above the gap.

* * * * *